(12) United States Patent
Nakamura

(10) Patent No.: US 8,062,539 B2
(45) Date of Patent: Nov. 22, 2011

(54) METHOD FOR MANUFACTURING MULTILAYER PRINTED WIRING BOARD AND MULTILAYER PRINTED WIRING BOARD OBTAINED BY THE SAME

(75) Inventor: Kensuke Nakamura, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 969 days.

(21) Appl. No.: 11/659,973

(22) PCT Filed: Aug. 9, 2005

(86) PCT No.: PCT/JP2005/014588
§ 371 (c)(1),
(2), (4) Date: Jan. 28, 2008

(87) PCT Pub. No.: WO2006/016586
PCT Pub. Date: Feb. 16, 2006

(65) Prior Publication Data
US 2008/0257480 A1    Oct. 23, 2008

(30) Foreign Application Priority Data
Aug. 10, 2004   (JP) ................................. 2004-233591

(51) Int. Cl.
*C03C 15/00* (2006.01)
(52) U.S. Cl. .............. 216/83; 216/17; 216/18; 257/528; 257/537; 257/758; 257/773; 29/25.42; 29/846; 29/852

(58) Field of Classification Search .................... 216/17, 216/18, 83; 257/528, 532, 758, 773; 29/25.42, 29/846, 852
See application file for complete search history.

(56) References Cited

U.S. PATENT DOCUMENTS

| | | | |
|---|---|---|---|
| 4,203,257 A * | 5/1980 | Jamison et al. | 451/36 |
| 5,784,782 A * | 7/1998 | Boyko et al. | 29/848 |
| 6,185,354 B1 * | 2/2001 | Kronz et al. | 385/129 |
| 6,349,456 B1 * | 2/2002 | Dunn et al. | 29/25.42 |
| 6,573,584 B1 * | 6/2003 | Nagakari et al. | 257/528 |

FOREIGN PATENT DOCUMENTS

| | | |
|---|---|---|
| JP | 8125302 A | 5/1996 |
| JP | 9116247 A | 5/1997 |
| JP | 2000-133916 A | 5/2000 |
| JP | 2000-323845 A | 11/2000 |
| JP | 2005-534791 A | 10/2002 |
| JP | 2003-11270 A | 1/2003 |
| JP | 2003-243795 A | 8/2003 |

* cited by examiner

Primary Examiner — Lan Vinh
Assistant Examiner — Maki Angadi
(74) Attorney, Agent, or Firm — Greenblum & Bernstein, P.L.C.

(57) ABSTRACT

A method for manufacturing a multilayer printed wiring board which enables the dielectric layers to have excellent thickness uniformity, the capacitor circuits to have high registration accuracy and the unnecessary dielectric layer is removed as large as possible; and a multilayer printed wiring board with an embedded capacitor circuit manufactured by the method.

14 Claims, 19 Drawing Sheets

(a)

(b)

(A)

(B)

(C)

(a)

(b)

(c)

(d)

(e)

(f)

(i)

(ii)

(A)

(B)

(I)

(II)

(III)

(iv)

(V)

(a)

(b)

(i)

(ii)

(c)

(d)

(e)

(f)

(a)

(b)

(c)

(d)

(a)

(b)

(c)

(a)

(b)

(c)

(d)

(e)

US 8,062,539 B2

METHOD FOR MANUFACTURING MULTILAYER PRINTED WIRING BOARD AND MULTILAYER PRINTED WIRING BOARD OBTAINED BY THE SAME

CROSS REFERENCE TO RELATED APPLICATION

This application is a 35 USC §371 National Phase Entry Application from PCT/JP2005/014588, filed Aug. 9, 2005, and designating the United States.

TECHNICAL FIELD

The present invention relates to a method for manufacturing a multilayer printed wiring board and a multilayer printed wiring board obtained by the manufacturing method. In particular, the invention provides a suitable method for manufacturing a multilayer printed wiring board with capacitor circuits embedded therein.

BACKGROUND ART

Traditionally used multilayer printed wiring boards with capacitor circuits embedded therein are such that one or more of the insulating layers locating in their inner layer(s) is(are) used as a dielectric layer(s) and top electrodes and base electrodes, as capacitors, face each other in the respective inner layer circuits locating on both sides of each dielectric layer. Accordingly, these capacitor circuits are sometimes referred to as embedded capacitor circuits.

For these multilayer printed wiring boards with embedded capacitor circuits, the manufacturing method shown in FIGS. 17 to 19, to which a popular process for manufacturing a printed wiring board is applied, has been examined. Specifically, it is expected that inner layer core material 2a shown in FIG. 17(a) (in the figure, insulating layer 3 with base electrodes 4 formed on its one side or both sides) is used and on both sides of inner layer core material 2a dielectric layer 5, for which a high-dielectric-constant material is used, and first conductive metal foil 6 are laminated so as to obtain the laminate in the state shown in FIG. 17(b).

Then, first conductive metal layers 6 locating as outer layers are processed into top electrodes with circuits, which are to be top electrodes 7 of capacitors, by etching or the like so as to obtain the state shown in FIG. 18(c). At this time, the area of each dielectric layer other than the circuits is exposed.

Then, on the top electrodes 7, prepreg 11 and second conductive metal foil 8 are laminated, as shown in FIG. 18(d) (in the figure, the skeletal material contained in the prepreg is omitted, and the same is applicable throughout this specification). And second conductive metal layers 8 locating as outer layers are processed into outer layer circuits to be top electrodes 7 of capacitors, by etching or the like so as to obtain multilayer printed wiring board 1' with embedded capacitors shown in FIG. 19(e).

The method for manufacturing a multilayer printed wiring board with embedded capacitors shown in FIGS. 17 to 19 uses a popular process for manufacturing a multilayer printed wiring board just as it is, whereby dielectric layers spread throughout the multilayer printed wiring board, allowing dielectric layers to exist not only on the base of capacitor circuits, but also on the base of power lines or signal lines and its vicinities. These dielectric layers cause the problem of increasing dielectric loss during the time of transmitting signals etc. since they have a high dielectric constant. Furthermore, in many cases, it is impossible to bury other devices, such as an inductor, in such dielectric layers, which usually imposes a certain constraint on circuit design.

Accordingly, to form dielectric layers only on the sites which require the layers, the method have been employed among persons skilled in the art in which the insulating layers provided on the surfaces of the inner layer substrates are subjected to hole-opening and in the resultant openings a high-dielectric-constant material is buried, as disclosed in Patent Document 1, or in which a layer of a resin film with capacitor circuits formed thereon in advance is transferred onto the surface(s) of an inner layer core material, as disclosed in Patent Document 2, or in which paste containing a dielectric filler is printed by screen printing, as disclosed in Patent Document 3.

[Patent Document 1] Japanese Patent Laid-Open No. 09-116247
[Patent Document 2] Japanese Patent Laid-Open No. 2000-323845
[Patent Document 3] Japanese Patent Laid-Open No. 08-125302

When intending to manufacture a multilayer printed wiring board with embedded capacitor layer by using the above described popular process for manufacturing a printed wiring board, however, a serious problem has arisen in laminating dielectric layer 5 and first conductive metal foil 6 on both sides of inner layer core material 2a shown in FIG. 17(a). The content of filler in dielectric layer 5 is generally higher than 80 wt %, and due to the small amount of resin, resin flow was low at the time of the lamination, thereby being unable to fill in the gaps among the base electrodes successfully, and hence it was impossible to obtain the ideal state as shown in FIG. 17(b).

Further, even if the above process can be employed successfully and remove the problem of the registration accuracy of the capacitor circuits, in the multilayer printed wiring board obtained by the above process, dielectric layers spread throughout the printed wiring board. Thus, it is impossible to allow dielectric layers to remain only on the sites where they are required. Furthermore, in the invention disclosed in Japanese Patent Laid-Open No. 2000-323845 or Japanese Patent Laid-Open No. 08-125302, though the problem can be eliminated of dielectric layers' remaining on the sites where they are not required, the invention still cause the problem of insufficient uniformity of dielectric layer thickness and insufficient registration accuracy when carrying out transfer method or screen printing method.

Capacitors are required to have the capacitance as largest as possible as their fundamental quality. The capacitance of a capacitor (C) is calculated by using the following equation, $C = \epsilon \epsilon_0 (A/d)$ (where $\epsilon_0$ is the dielectric constant of vacuum). Particularly because of the recent trend toward down-sizing of electronic or electric equipment, printed wiring boards are also required to be down-sized, and it is almost impossible to increase the area of capacitor electrodes within a given area of printed wiring boards. Thus, it is apparent that the improvement in the surface area (A) has a limitation. Accordingly, to increase the capacitance of capacitors, it is necessary to decrease the thickness (d) of dielectric layers, when the surface area (A) of capacitor electrodes and the relative dielectric constant ($\epsilon$) of dielectric layers are constant. In such a situation, insufficient uniformity of dielectric layer thickness is not favorable because it may cause greater deviation in capacitor quality.

In the case where the problem of registration accuracy is involved in carrying out transfer method or screen printing method, deviation is created between the positions of top electrodes and base electrodes carefully formed. As a result, the effective area of the surface area (A), which influences the capacitance of capacitors, may decrease, thereby making it impossible to obtain capacitor performance as it is designed. It may cause out-of-specification of product quality.

Thus, there has been a need for a method for manufacturing a multilayer printed wiring board which does not require a complicated manufacturing process, provides excellent uniformity of dielectric layer thickness and registration accuracy of capacitor circuits and largest area of dielectric layer as possible except for that of the capacitor circuit portion is removed and for a multilayer printed wiring board with capacitor circuits embedded therein which is manufactured by using such a method.

DISCLOSURE OF THE INVENTION

Under these conditions, the present inventor directed tremendous research effort toward a solution of the above described problems, and he finally thought out the method of the present invention, for manufacturing a multilayer printed wiring board with capacitor circuits embedded in its inner layer(s). In this manufacturing method, a conventional and a most popular process for manufacturing a printed wiring board can be employed; thus, it requires no special investment in facilities and its industrial merit will be great.

The multilayer printed wiring board of the present invention is a multilayer printed wiring board with capacitor circuits embedded in its inner layer(s) which is obtained by employing a manufacturing method which includes steps A1 to E and steps A2 to E with additional step F after step C as shown below. Specifically, the multilayer printed wiring board of the present invention is manufactured according to the following manufacturing step patterns.

(First Pattern)

Step A1: A first-conductive-metal-layer laminating step where a dielectric layer and a first conductive metal layer are provided on the surface which has a base electrode of a core material with base electrode(s) on one side or both sides of its insulating layer.

Step B: An top-electrode forming step where the first conductive metal layer(s) locating as an outer layer(s) is(are) processed into top electrodes and the dielectric layer(s) in the area other than those of circuit portions is(are) exposed.

Step C: A dielectric-layer removing step where the exposed dielectric layer(s), which is (are) in the area other than those of circuit portions, is (are) removed.

Step D: A second-conductive-metal laminating step where the gaps among the top electrodes are filled in and an insulating layer and a second conductive metal layer are provided on the top electrodes.

Step E: An outer layer circuit forming step where the second conductive metal layer(s) is (are) processed into outer layer circuits.

(Second Pattern)

Step A2: A first-conductive-metal-layer laminating step where a dielectric layer and a first conductive metal layer is provided on the metal layer side(s) of a core material having a metal layer, which is to be base electrodes, on the whole surface of one side or both sides of its insulating layer.

Step B: An top-electrode forming step where the first conductive metal layer(s) locating as an outer layer(s) is(are) processed into top electrodes and the dielectric layer(s) in the area other than those of circuit portion is(are) exposed.

Step C: A dielectric-layer removing step where the exposed dielectric layer, which is in the area other than those of circuit portions, is removed.

Step F: A step of forming a specified base electrode circuit pattern on the laminate where the dielectric layer has been removed through steps A2 to C and the metal layer for base electrodes is exposed.

Step D: A second-conductive-metal laminating step where the gaps among the top electrodes are filled in and an insulating layer and a second conductive metal layer are provided on the top electrodes.

Step E: An outer layer circuit forming step where the second conductive metal layer(s) is (are) processed into outer layer circuits.

To avoid repetition, the description of the steps common to the above two patterns will be given only once.

In manufacturing a multilayer printed wiring board of the present invention, as a core material that contains base electrodes on one side or both sides of its insulating layer, either an conventional double sided printed wiring board, as shown in FIG. 1(A), or a printed wiring board having flat surfaces where base electrode circuits are buried in its insulating layer, as shown in FIG. 1(B), can be used. However, the process for forming dielectric layers should be different depending on core material which is employed; therefore, detail description will be given with reference to the following embodiments.

To form a core material that contains electrodes on only one side of its insulating layer, both of a method in which a metal layer is provided on one side of the insulating layer while a releasing film is provided on the opposite side of the insulating layer, and a method in which a metal layer is provided on both sides of the insulating layer and then the metal layer of one side alone is etched out are commonly employed. To stabilize the adhesion of the dielectric layer afterwards, it is recommended to employ the latter method to make the resin surface uneven or, when employing the former method, it is recommended to subject the metal layer to mechanical or chemical roughening treatment.

When forming base electrodes, it is preferable, from the viewpoint to improve registration accuracy and to lessen deviation in capacitance of capacitors, to allow them to be a little larger in size than intended top electrodes.

When using a printed wiring board having a bumpy surface where electrode circuits protrude from the surface of its insulating layer, as a core material having base electrode circuits on one side or both sides of its insulating layer used in the step A1, and when employing the step A2, it is preferable to form a dielectric layer on the surface of the core material by laminating a dielectric layer constituting material that consists of a resin-alone layer on a dielectric-filler-containing layer.

The method for forming a dielectric layer by laminating a dielectric layer constituting material that consists of a resin-alone layer on a dielectric-filler-containing layer also makes it possible to stack plural dielectric layers, thereby allowing higher degree of freedom in total capacitance of capacitors and arrangement of the same.

When using a printed wiring board having a flat surface in which base electrode circuits are buried in its insulating layer, as a core material that contains base electrode circuits on one side or both sides of its insulating layer used in the step A1, it is possible to directly laminate a dielectric-filler-containing layer on the surface of the core material to use the layer as a dielectric layer.

And in the dielectric layer removing step, to remove the dielectric layer(s) exposed among the first electrode circuits, an removing method using chemical dissolutions, in particular, de-smear treatment is preferably used.

Further, in the dielectric layer removing step, to remove the dielectric layer(s) exposed among the first electrode circuits, a removing method using mechanical processing, in particular, blast treatment is preferably used.

In the multilayer printed wiring board with embedded capacitor circuits obtained by the above described manufacturing method, the capacitor circuit portions are held in the resin that constitutes the insulating layer, since the largest part as possible of the dielectric layers other than those of the embedded capacitor portions has been removed. As a result, the problem of the adhesion of the dielectric layer(s) to the insulating layer is not created and the occurrence of delamination in the inner layer is decreased. Besides, a satisfactory wiring board can be manufactured in which the thickness uniformity of the dielectric layers is excellent, the registration accuracy of the capacitor circuits is high and the variation in capacitance of the capacitors is lessened, as long as this manufacturing method is employed.

According to the method of the present invention for manufacturing a multilayer printed wiring board with embedded capacitor circuits, the dielectric layer is removed from the sites where it is not needed. Thus, even if signal circuits are formed on the same surface where capacitor circuits have been already formed, dielectric loss is not increased when signals etc. are transmitted, and besides, other circuit devices such as an inductor can also be buried, whereby the constraint imposed on the circuit design can be considerably relieved. As a result, the multilayer printed wiring board with embedded capacitor circuits which is obtained by this manufacturing method is of very high quality.

BRIEF DESCRIPTION OF THE DRAWINGS

FIGS. 2(a) to 2(b) are schematic views showing the manufacturing flow for manufacturing a multilayer printed wiring board with embedded capacitor circuits using core material 2a;

FIGS. 3(c) to 3(d) are schematic views showing the manufacturing flow for manufacturing a multilayer printed wiring board with capacitor circuits embedded in its inner layers using core material 2a;

FIGS. 4(e) to 4(f) are schematic views showing the manufacturing flow for manufacturing a multilayer printed wiring board with capacitor circuits embedded in its inner layers using core material 2a;

FIGS. 5(i) to 5(ii) are schematic views showing a process for providing a dielectric layer and a first conductive metal layer on each surface of core material 2a;

FIGS. 7(I) to 7(III) are schematic views showing the dielectric layer removing process using a blasting treatment;

FIGS. 10(i) to 10(ii) are schematic views showing a process for providing a dielectric layer and a first conductive metal layer on the surface of core material 2b;

Figure 1:
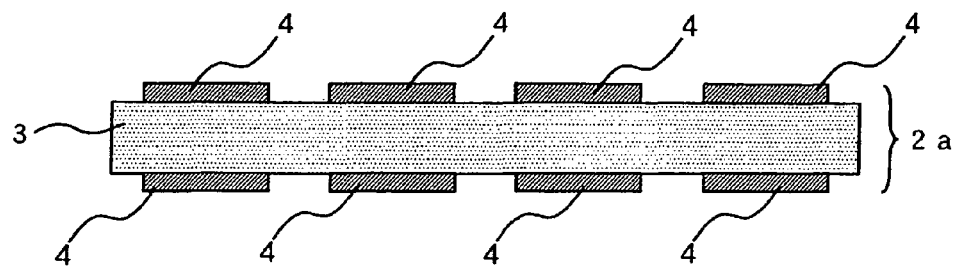
FIGS. 1(A) to 1(C) are schematic cross-sectional views of 3 types of typical core materials used in the present invention.
Figure 1:
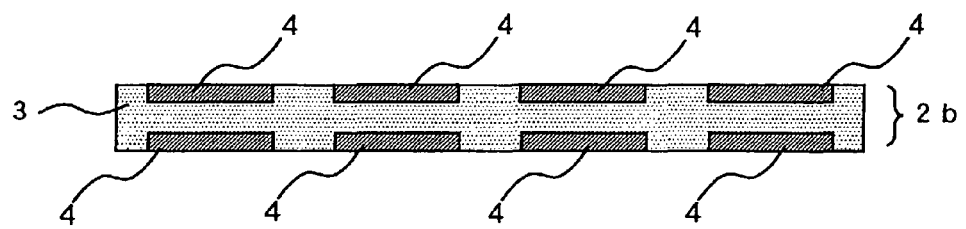
Figure 1:
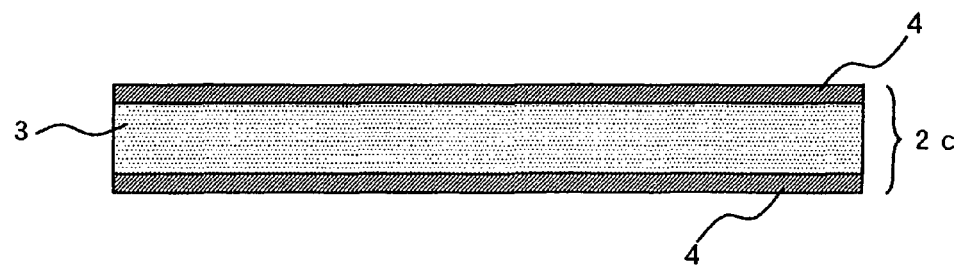
Figure 2:
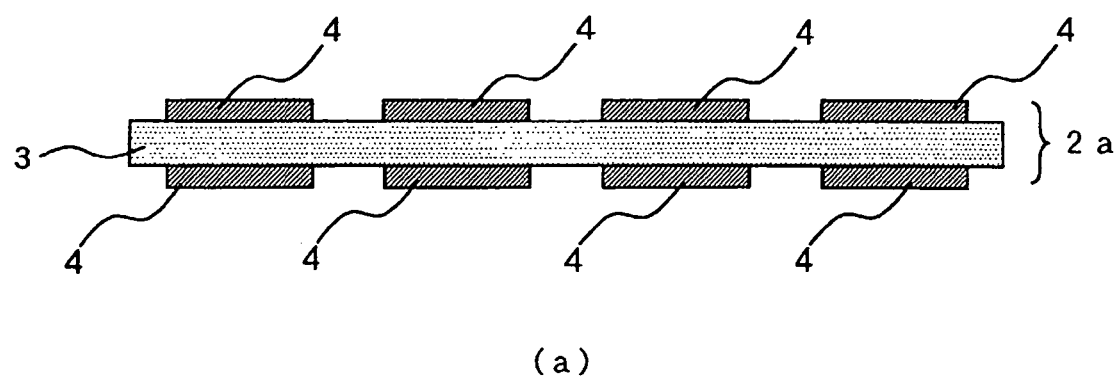
Figure 2:
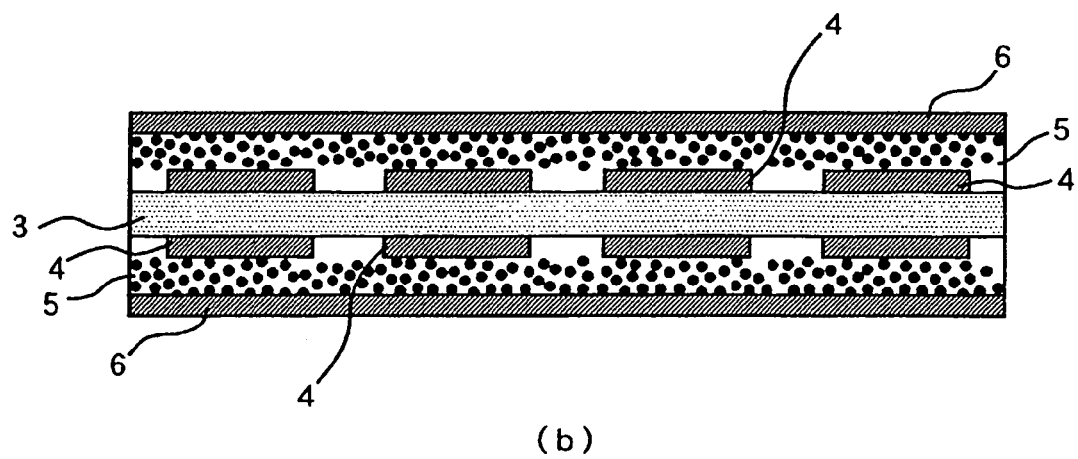

| Description of Symbols | |
|---|---|
| 1, 1' | Multilayer printed wiring board with embedded capacitor circuits |
| 2a, 2b, 2c | Core material (a: Base electrodes on both sides of the material are bumpy. b: Base electrodes on both sides of the material are buried. c: Base electrodes on both sides of the material are conductive metal layer) |
| 3 | Insulating layer (resin film, prepreg or the like) |
| 4 | Base electrode (Base electrode circuit) |
| 5 | Dielectric layer |
| 6 | First conductive metal layer or metal foil |
| 7 | Top electrode (Top electrode circuit) |
| 8 | Second conductive metal layer |
| 9 | Outer layer circuit |
| 10 | Etching resist layer |
| 20 | Film of dielectric-filler-containing resin solution |
| 21 | Fine copper particle |
| 22 | Dielectric layer in the semi-cured state |
| 23, 23' | Dielectric-filler-containing resin coated metal foil |
| 30 | dielectric-filler-containing sheet |
| 31 | dielectric-filler-containing resin layer |
| 32 | Film of dielectric filler free resin solution |
| 40 | Copper foil circuit with carrier foil |
| 41 | Carrier foil |
| 42 | Bonding interface layer (Releasing layer) |
| 43 | Copper foil layer for circuit formation |
| 44 | Electrodeposited copper foil with carrier foil |

BEST MODE FOR CARRYING OUT THE INVENTION

In the following, the present invention will be described in more detail with reference to certain embodiments and examples.

EMBODIMENTS OF THE INVENTION

The description will be given separately in terms of "a method for manufacturing a multilayer printed wiring board with embedded capacitor circuits" and "a multilayer printed wiring board with embedded capacitor circuits".

<Method 1 for Manufacturing a Multilayer Printed Wiring Board with Embedded Capacitor Circuits>

A method for manufacturing a multilayer printed wiring board with embedded capacitor circuits (hereinafter referred to simply as "multilayer printed wiring board"), which is according to the present invention, will be described using mainly FIGS. 2 to 6 and FIGS. 13 to 16 as aids. In the present invention, drawings are often used for the illustrative purpose. In such drawings, via holes etc. to connect the capacitor portions and the circuits between layers can be formed at any time and into any shape by the popular method. Accordingly, the illustrations of such layer to layer connection means are omitted. And for clear understanding of the present invention as technical idea, the procedures of lamination and those of the removing of dielectric layers are mainly illustrated. The same applies to the drawings used in the description of Background Art. Further, in the drawings, only the process in which a dielectric layer(s) is (are) formed on both sides of a core material are illustrated, though the present invention covers the case where a dielectric layer is formed on only one side of a core material, since a dielectric layer(s) can be easily formed by the conventional method easily in either case.

The method for manufacturing a multilayer printed wiring board of the present invention is characterized in that it includes steps A to F described below. Accordingly, the method will be described in the order of the steps. It specifies that the method described below just employs the most typical and popular process for manufacturing a multilayer printed wiring board, and therefore, it is applicable to any process for manufacturing a multilayer printed wiring board with embedded capacitor circuits that contains the technical idea below.

(Step A1-1)

This step is to provide a dielectric layer and a first conductive metal layer on one side or both sides of a core material, which has base electrode circuits on both side of its insulating layer, and is referred to as first conductive metal layer laminating step.

Core material 2a used here is a material shown in FIG. 2(a) (the same as the one shown in FIG. 1(A)). And insulating layer 3 includes all the "insulating layer" concepts such as those constructed by using a traditionally used glass-epoxy base material, glass-polyimide base material or the like. The base electrode circuit includes an electrode form which is to be one end of a capacitor electrode. Of a pair of capacitor electrodes, one is called top electrode and the other base electrode; however, in the present invention, the capacitor electrode formed in the surface of a base electrode circuit is called base electrode 4.

Generally, a base electrode circuit including capacitor base electrode 4 is formed by laminating metal foil on both sides of the insulating layer of such a core material and etching the metal foil. To connect the base electrode circuits on both sides of a base electrode circuit by using a through hole or via hole, layer to layer connection is performed by the popular method before etching the base electrode circuit.

If dielectric layer 5 and first conductive metal layer (metal foil) 6 are laminated on both sides of the core material, a laminate in the state shown in FIG. 2(b) is obtained. The lamination of a dielectric layer and a first conductive metal layer will be described later.

The term "dielectric layer" herein used mostly means a layer consisting of dielectric filler and an organic material. The organic material herein can be any organic material and is not specifically limited as long as it makes it possible to laminate the dielectric layer and metal foil and to maintain, to say the least of it, the shape of the dielectric layer. The organic material acts as a binder resin for forming the dielectric filler into the shape of a dielectric layer.

The dielectric filler, which is dispersed in the dielectric layer, is used to increase the capacitance of a capacitor when the dielectric layer is finally processed into a capacitor shape. As the dielectric filler, generally, dielectric powder of a composite oxide having a pevroskite structure, such as $BaTiO_3$, $SrTiO_3$, $Pb(Zr-Ti)O_3$ (so called PZT), $PbLaTiO_3.PbLaZrO_3$ (so called PLZT) or $SrBi_2Ta_2O_9$ (so called SBT), is used. Preferably, powder whose particle size is in the range of 0.1 to 1.0 μm is used as the dielectric filler. At the present stage, in the composite oxides having a pevroskite structure, barium titanate is preferably used as the dielectric filler, considering the production accuracy of the powder. As a dielectric filler at this time, either calcined barium titanate or uncalcined barium titanate can be used. When intending to achieve a high dielectric constant, it is preferable to use calcined barium titanate; however, selection can be made depending on the design quality of a printed wiring board product.

Most preferable barium titanate used as the dielectric filler has a cubic crystal structure. There are two types of crystal structure of barium titanate, cubic and tetragonal. When the dielectric filler of barium titanate having a cubic crystal structure is used, the dielectric constant of the resultant dielectric layer is consistent, compared with when the dielectric filler of barium titanate having a tetragonal crystal structure alone is used. Accordingly, it is necessary to use, to say the least of it, powder of barium titanate where a cubic crystal structure and a tetragonal crystal structure coexist.

The organic material and dielectric filler described above are mixed to obtain a dielectric-filler-containing resin solution and used for forming dielectric layer(s) of capacitor layers embedded in a printed wiring board. The mixing ratio of the organic material to the dielectric filler is desirably such that it allows the content of the dielectric filler in the resultant dielectric-filler-containing resin solution to be 75 wt % to 85 wt % and the content of the organic material to be the remaining 15 wt % to 25 wt %. If the content of the dielectric filler is lower than 75 wt %, the relative dielectric constant of the dielectric layer required in the market cannot be satisfied, whereas if the content of the dielectric filler is higher than 85 wt %, the content of the organic material is lower than 15 wt %, which affects the adhesion between the dielectric-filler-containing resin and metal foil bonding on the resin, thereby making it difficult to obtain a laminate that meets the property requirements for a laminate used in a printed wiring board.

Figure 5:
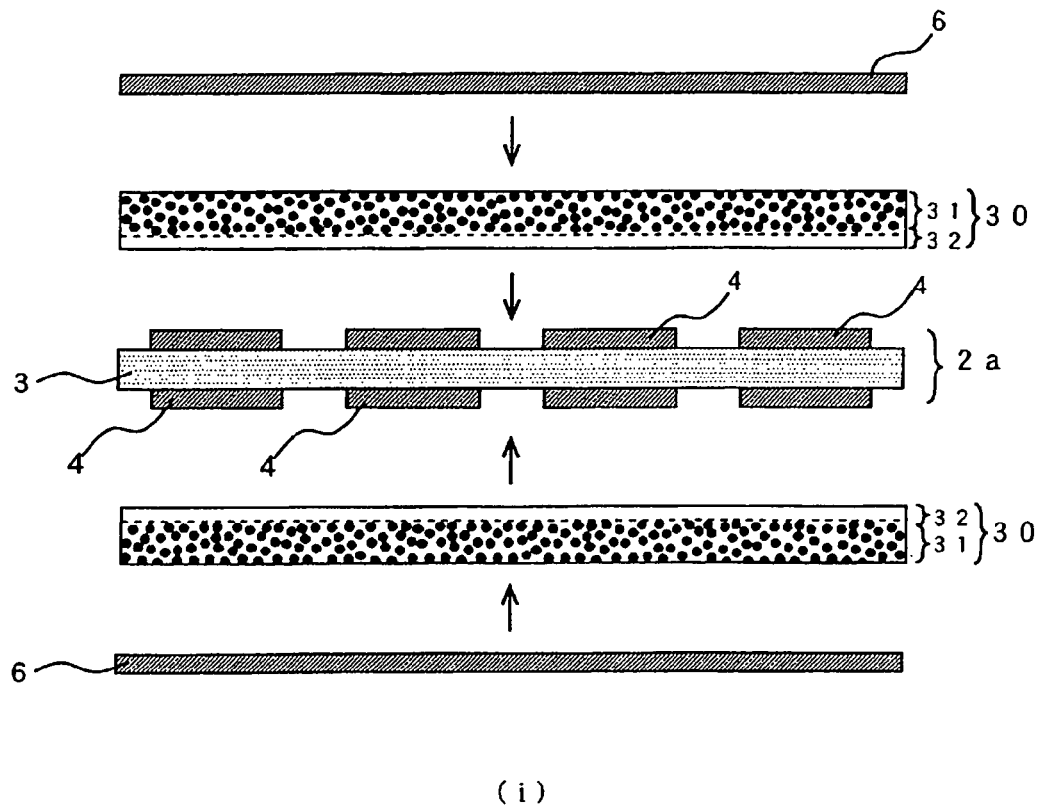
Figure 5:
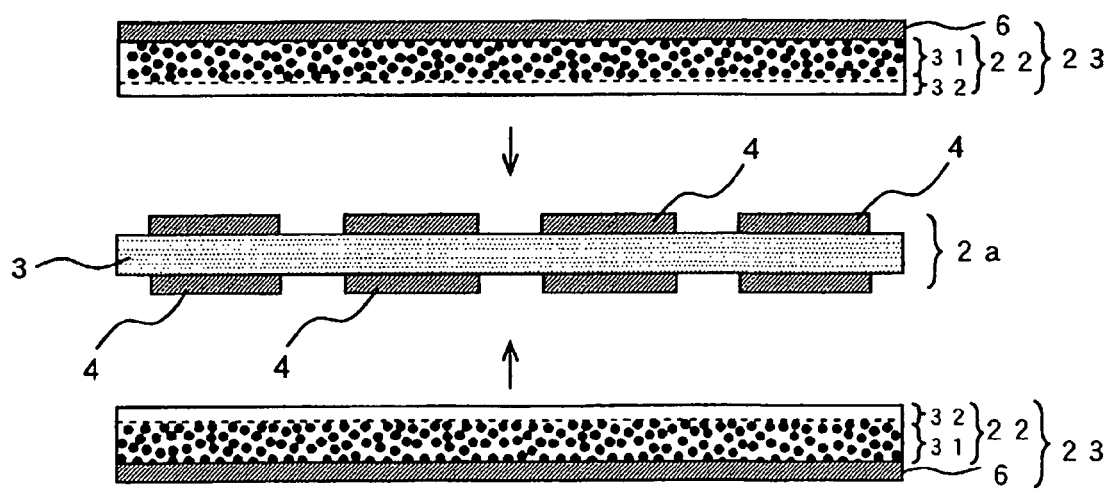

To provide a dielectric layer and a first conductive metal layer on both sides of the core material, a method is employed in which dielectric-filler-containing layer sheet 30 and metal foil 6 are used independently, as shown in FIG. 5(i), or in which dielectric-filler-containing resin coated metal foil 23 is used, as shown in FIG. 5(ii). However, use of dielectric-filler-containing resin coated metal foil 23 shown in FIG. 5(ii) seems more favorable, because it provides a dielectric layer thinner finished.

What is more important is that when the core material having base electrode circuits on both sides of its insulating layer has bumpy surfaces where base electrode circuits protrude from the respective surfaces of the insulating layer or when the metal layers, which are to be base electrode circuits, that constitute the core material exist on the whole surface of the respective sides of the insulating layer, a dielectric-filler-containing sheet is used which has a two-layer structure made up of dielectric-filler-containing layer 31 with resin-alone layer 32, as is seen from FIG. 5(*i*). Likewise, dielectric-filler-containing resin coated metal foil 23 is used in which dielectric layer 22 in the semi-cured state has a two-layer structure made up of dielectric-filler-containing layer 31 with resin-alone layer 32, as is seen from FIG. 5(*ii*).

Figure 6:
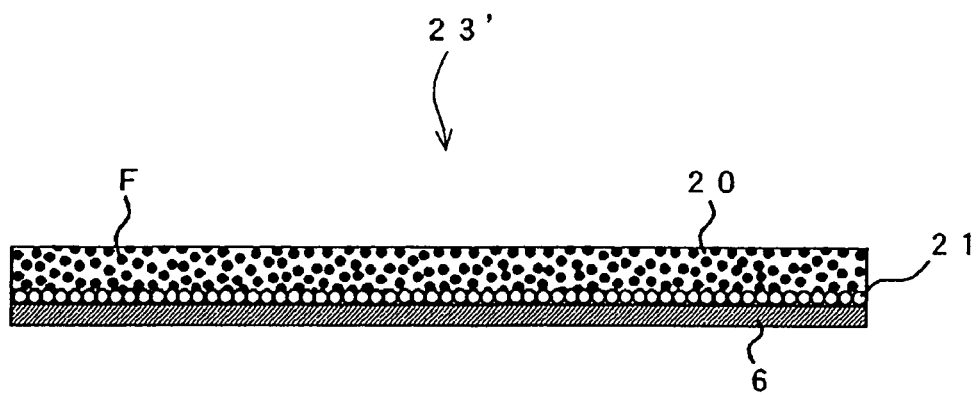
FIGS. 6(A) to 6(B) are schematic views showing the manufacturing flow for manufacturing a dielectric-filler-containing resin coated metal foil.
Figure 6:
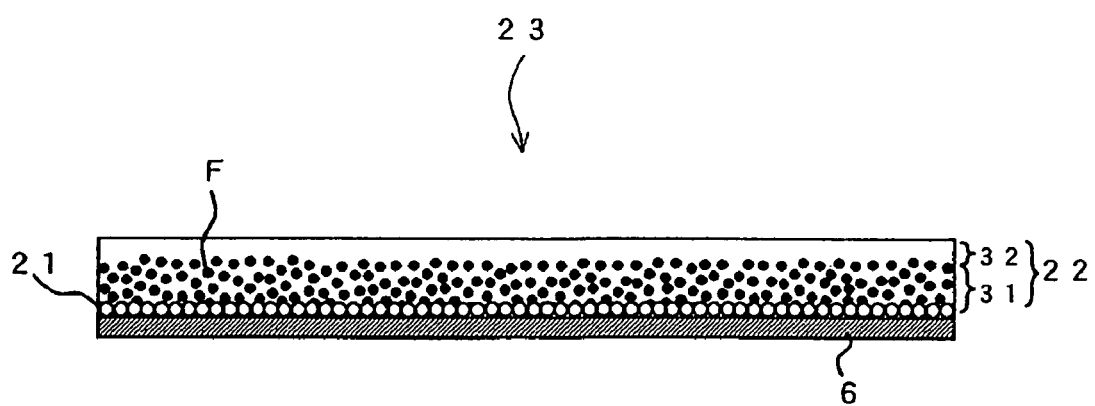

The dielectric-filler-containing resin coated metal foil 23 is obtained as shown in FIG. 6. Specifically, the above described dielectric-filler-containing resin solution is coated onto the bonding surface of metal foil 6 to a specified thickness so that film of dielectric-filler-containing resin solution 20 is formed. Then, the film is dried to form dielectric-filler-containing resin coated metal foil 31 in the semi-cured state on metal foil 6 (this stage is the same as the manufacturing process 2 for dielectric-filler-containing resin coated metal foil 23' which is described later). Then, the resin-alone is coated on the surface and dried to form the resin-alone layer 32 as shown in FIG. 6(B). Thus, the dielectric-filler-containing resin coated metal foil 23 is obtained. The bonding surface of metal foil is a surface used for adhesion to a dielectric layer, and usually it has undergone roughening treatment with fine copper particles 21 which are expected to be buried into the resin and show an anchor effect. In FIG. 6, metal foil with fine copper particles put on its surface is illustrated as an image. However, the illustration of such roughening treatment is omitted in the drawings which do not necessarily require such illustration. To keep the thickness of dielectric layers uniform, as metal foil used in a metal clad laminate that constitutes a capacitor layer, preferably the product as flat as possible is used. Accordingly, very-low-profile (VLP) copper foil or rolled copper foil is preferably used. Metal foil does not always need roughening treatment. In the drawings, black dots indicate dielectric filler F.

To dry the film of dielectric-filler-containing resin solution 20 having been coated on metal foil 6, a method such as just air drying, just heating or the combination thereof can be employed. As a drying atmosphere, any atmosphere, such as drying in air or drying in vacuum, can be employed so that it matches the process. Then, a specified amount of resin is coated onto dielectric-filler-containing resin layer 31 and dried in the same manner as above to give the resin-alone layer 32. Thus, a dielectric-filler-containing resin composite layer is prepared. The thickness of the resin-alone layer is arbitrarily adjusted depending on the height (thickness) of the base electrode circuits. Thus, dielectric layer 22 in the semi-cured state can be formed on metal foil 6.

In the above described step, if a releasing film is used instead of metal foil 6 and the film is stripped off after drying, a dielectric-filler-containing sheet can be obtained.

(Step B)

Figure 3:
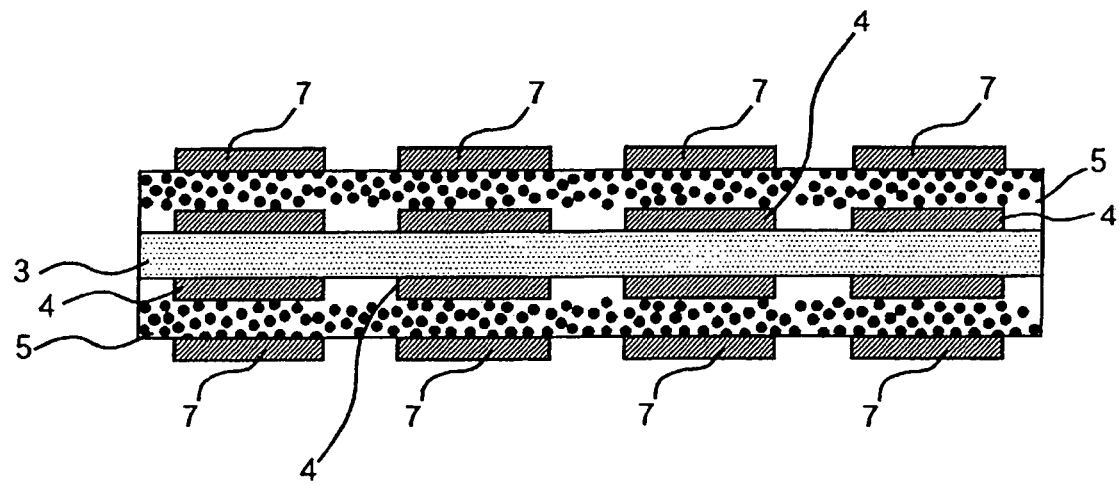
Figure 3:
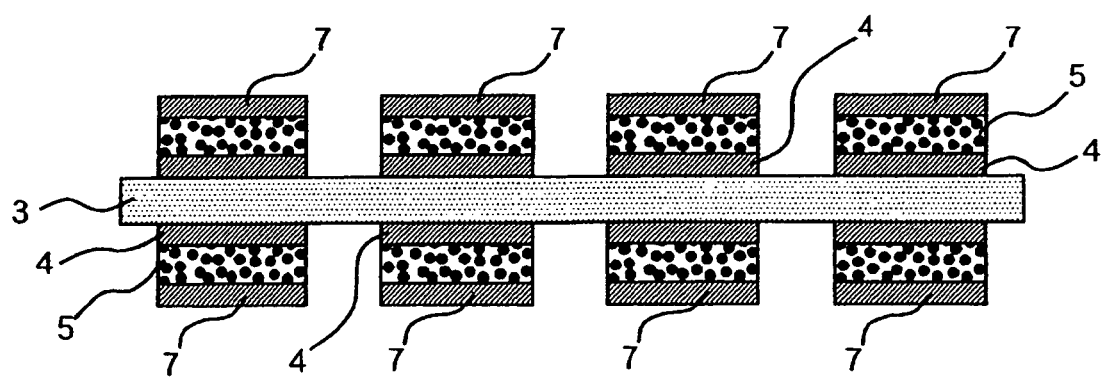

This step is a step of processing the first conductive metal layer(s) locating as an outer layer(s) into top electrodes 7 and exposing dielectric layer(s) 5 in the area other than those of the top electrodes. This step is referred to as top-electrode forming step. To process the first conductive metal layer 6 into top electrodes, usually an etching process is used for forming the first conductive metal layer 6. When processing is carried out by an etching process, an etching resist layer is provided on the first conductive metal layer(s) by using a dry film resist, a liquid resist or the like which can be used as an etching resist. And the resist pattern is exposed on the etching resist and developed, and the unnecessary part of the first conductive metal layer is dissolved and removed by using an etchant so that top electrodes 7 are formed as shown in FIG. 3(*c*). In this step, top electrodes 7 are provided in such positions facing to the respective base electrodes 4 formed in the base electrode circuits across dielectric layer 5.

(Step C)

This step is a step of removing exposed dielectric layer 5, which is in the area other than those of circuit portions, and it is referred to as dielectric-layer removing step. There are two available methods for removing dielectric layer 5 in this step. It is preferable to use the following methods: one is a method using de-smear treatment, typical chemical treatment, and the other is a method using blasting treatment (especially wet blasting treatment), typical mechanical treatment.

The case where the former method, that is, de-smear treatment is used will be described. De-smear treatment is treatment using a de-smear solution which is for removing burr-like resin (resin smear) generated when, for example, drilling a printed wiring board so as to make through holes. As a de-smear solution, a commercially available one can be used. The organic component of the dielectric layer exposed in the gaps among circuits is dissolved by the de-smear solution, thereby the dielectric layer is removed. As described above, the dielectric layer has a low content of organic component, and therefore, the organic component is easily dissolved in a de-smear solution. When carrying out de-smear treatment, it is desirable to strip the resist layer in advance which having been used in etching as shown in FIG. 3(*d*). Thus, the unnecessary dielectric layer can be removed.

Figure 7:
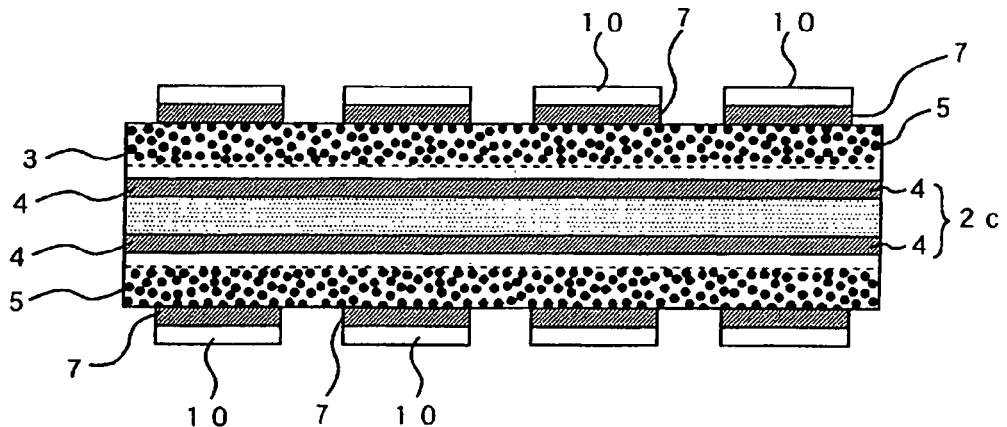
Figure 7:
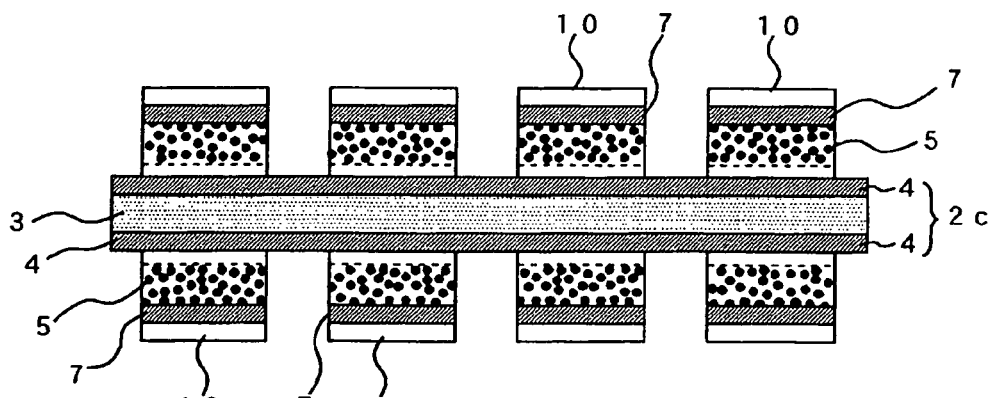
Figure 7:
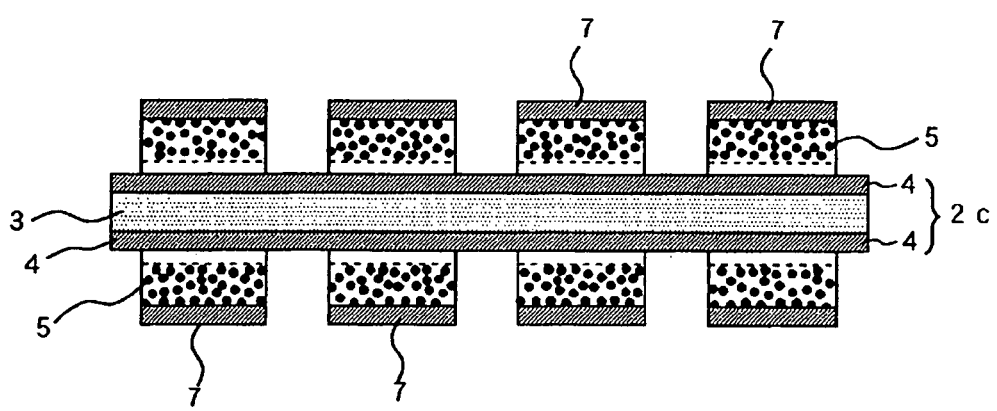

"Blasting treatment", the latter method, herein used is intended to mean both dry blasting treatment and wet blasting treatment. However, considering the quality of the surface having undergone blasting treatment and to decrease damage on the circuit surface, it is preferable to employ wet blasting treatment. The wet blasting treatment is abrasion treatment carried out by shooting a slurry-like abrasive fluid, in which abrasive as fine powder was dispersed in water, as high-velocity fluid stream at the target surface and enables the abrasion of even narrow area. The wet blasting treatment is characterized in that it allows abrasion to be performed more precisely causing less damage to its target than dry blasting treatment, which is carried out in dry circumstances. Unnecessary dielectric layer is removed by removing the dielectric layer exposed in the gaps among circuits by using wet blasting treatment. In blasting treatment, to prevent the damage to the circuit portions from being caused by the impact of the abrasive, preferably the removing of the exposed dielectric layer(s) is carried out following the process shown in FIG. 7. After finishing the etching of top electrodes, blasting treatment is carried out while leaving the etching resist layer 10 on the top electrodes as shown in FIG. 7(I) to bring the laminate to the state shown in FIG. 7(II). Doing such allows the etching resist layer 10 to work as a shock absorber against the abrasive's impact, thus making it possible to prevent the damage to the circuits. Then, the resist is stripped to obtain the laminate in the state shown in FIG. 7(III).

(Step D)

Figure 4:
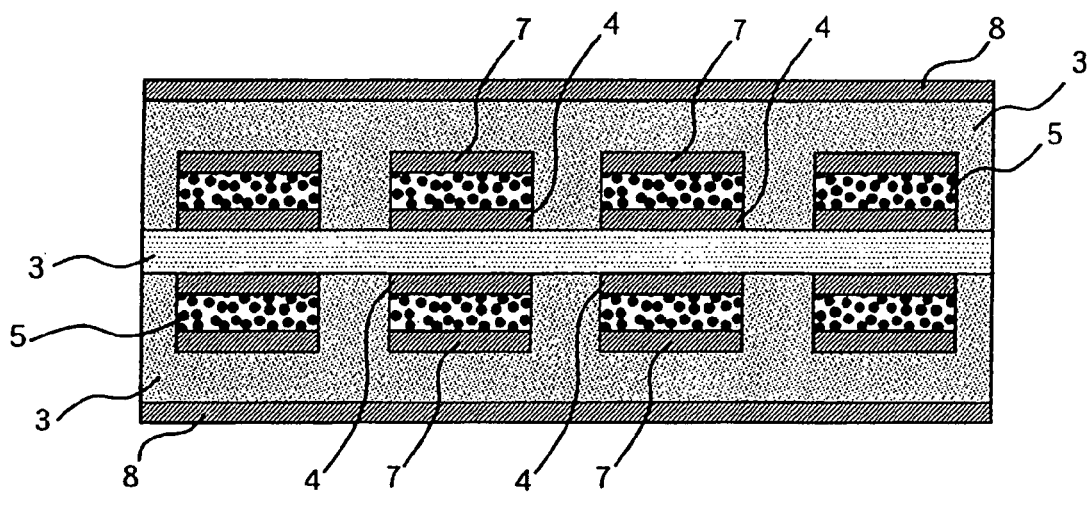
Figure 4:
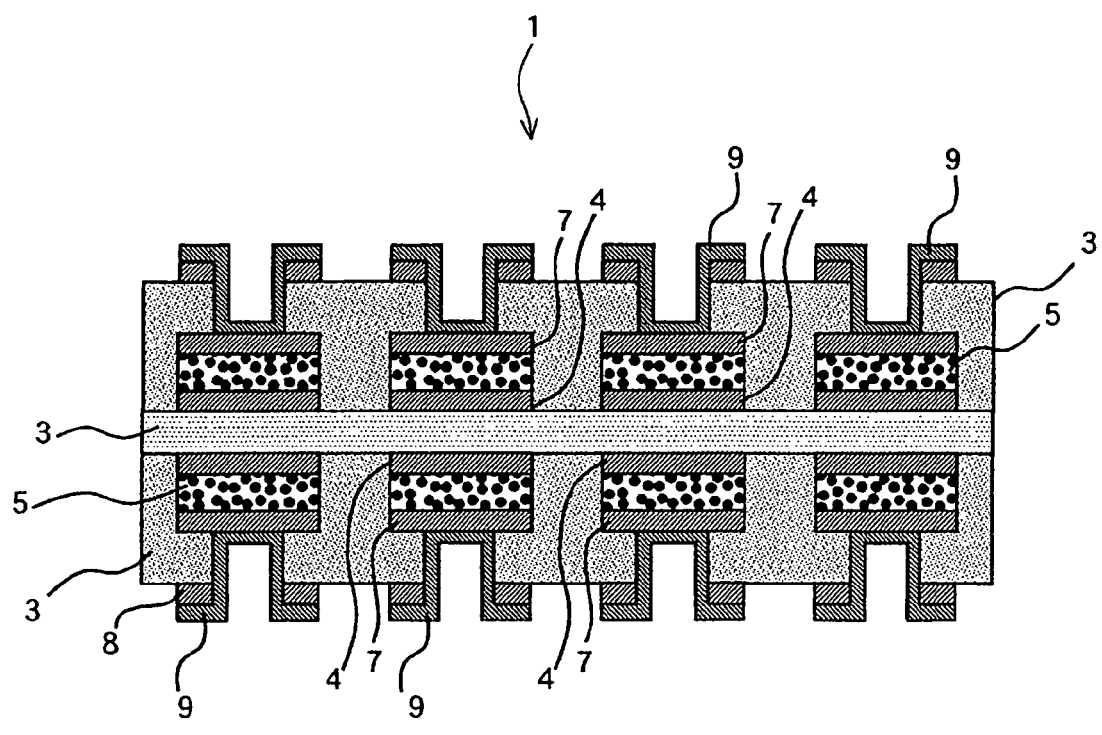

This step is a step of filling in the gaps among the top electrodes. The gaps got depth as shown in FIG. 3(*d*) by removing the exposed dielectric layer(s), and dielectric layer 3 and second conductive metal layer 8 are provided on the top electrodes, as shown in FIG. 4(*e*). The step is referred to as second-conductive-metal-layer laminating step. The method of forming the insulating layer and the second conductive metal layer is not limited to any specific one. Applicable methods include: for example, a method in which a prepreg and metal foil are laminated on the top electrodes at the same time; or a method in which resin coated copper foil is laminated on the top electrodes.

(Step E)

In this step, the second conductive metal layer(s) is processed into outer layer circuits 9 by etching the same while forming via holes. The step is referred to as outer layer circuit forming step. The method of etching the second conductive metal layer(s) 8 is the same as that of etching the first conductive metal layer(s) 6; therefore, to avoid repetition, the description of the method will be omitted. Those via holes can be formed by the popular method. The state in which the outer layer circuits 9 (with via holes) have been formed is shown in FIG. 4(*f*).

<Method 2 for Manufacturing a Multilayer Printed Wiring Board with Embedded Capacitor Circuits>

A method for manufacturing a multilayer printed wiring board with capacitor circuits embedded in its inner layer(s) (hereinafter referred to simply as "multilayer printed wiring board"), which is according to the present invention, will be described by using FIGS. 9 to 12 and FIGS. 13 to 16 as aids. The description will be omitted of the portion to which the same concept as that described in <Process 1 for manufacturing a multilayer printed wiring board with embedded capacitor circuits> is applicable.

The method for manufacturing a multilayer printed wiring board of the present invention is characterized in that it includes steps A to E described below. Accordingly, the method will be described in the order of the steps. It specifies that the method described below just employs the most typical and popular process for manufacturing a multilayer printed wiring board, and therefore, it is applicable to any process for manufacturing a multilayer printed wiring board that contains the technical idea below.

(Step A1-2)

Figure 9:
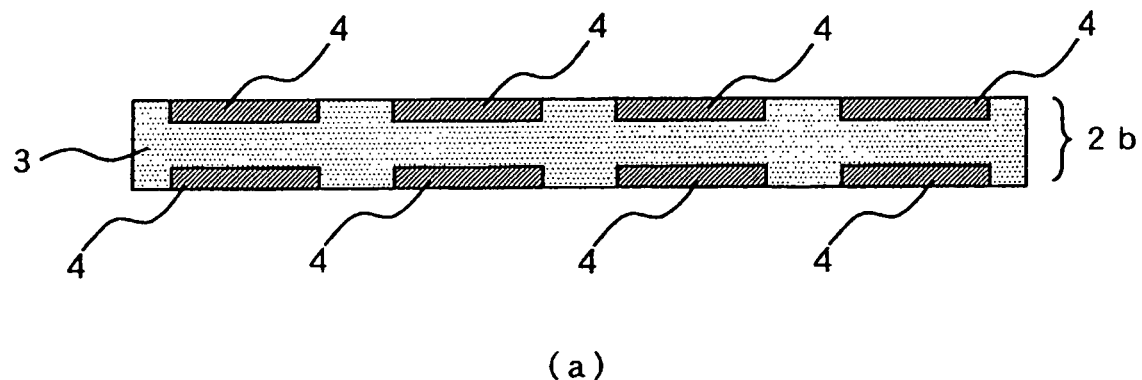
FIGS. 9(a) to 9(b) are schematic views showing core material 2b with a dielectric layer and a first conductive metal layer provided on its both surfaces.
Figure 9:
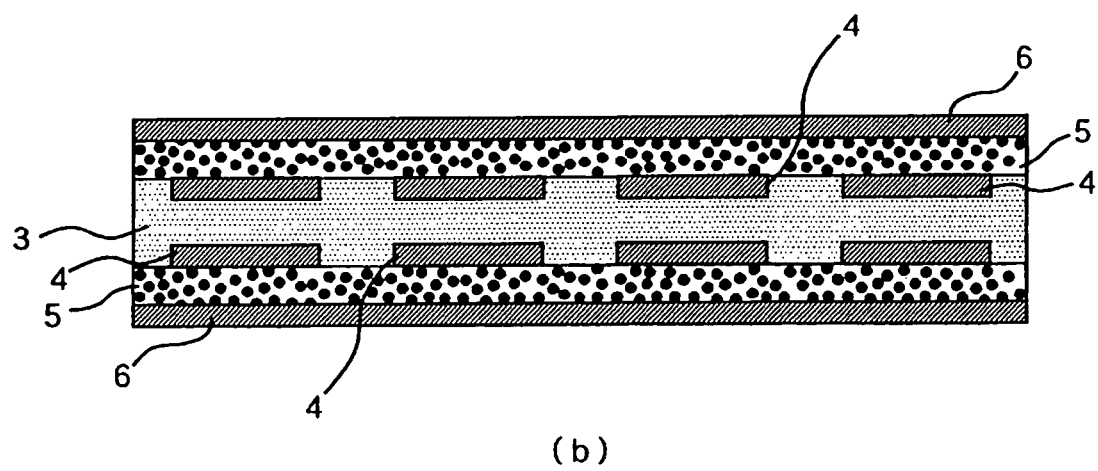

The core material 2*b* used in this process is as shown in FIG. 9(*a*) (the same as the one shown in FIG. 1(B)). A core material obtained by any production process can be used as long as it has base electrode circuits buried in its insulating layer 3 and its surfaces are flat.

Figure 14:
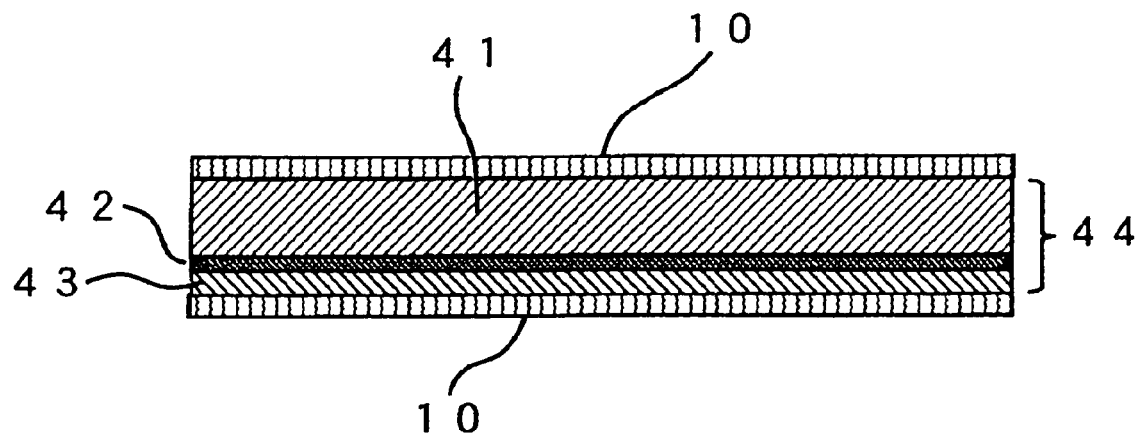
FIGS. 14(a) to 14(b) are schematic cross-sectional views showing the manufacturing flow for manufacturing a copper foil circuit with carrier foil.
Figure 14:
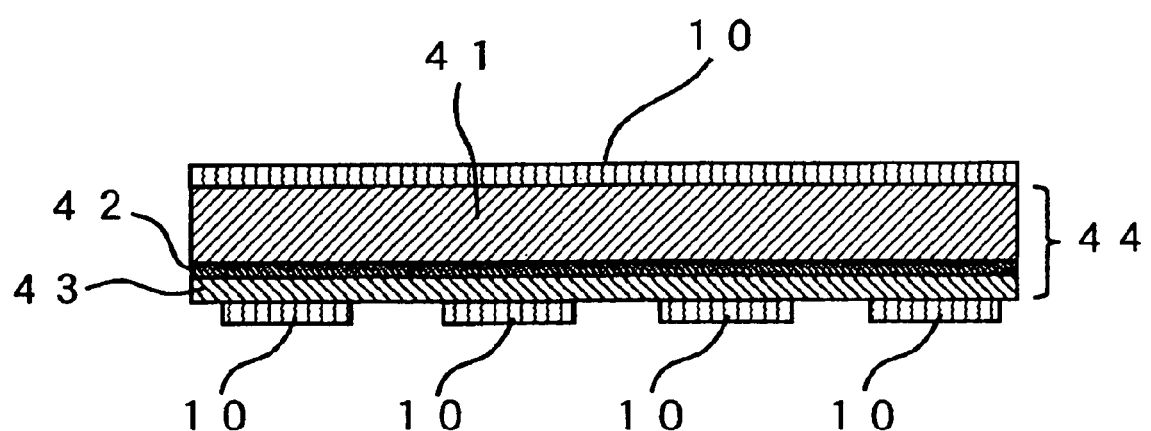
Figure 15:
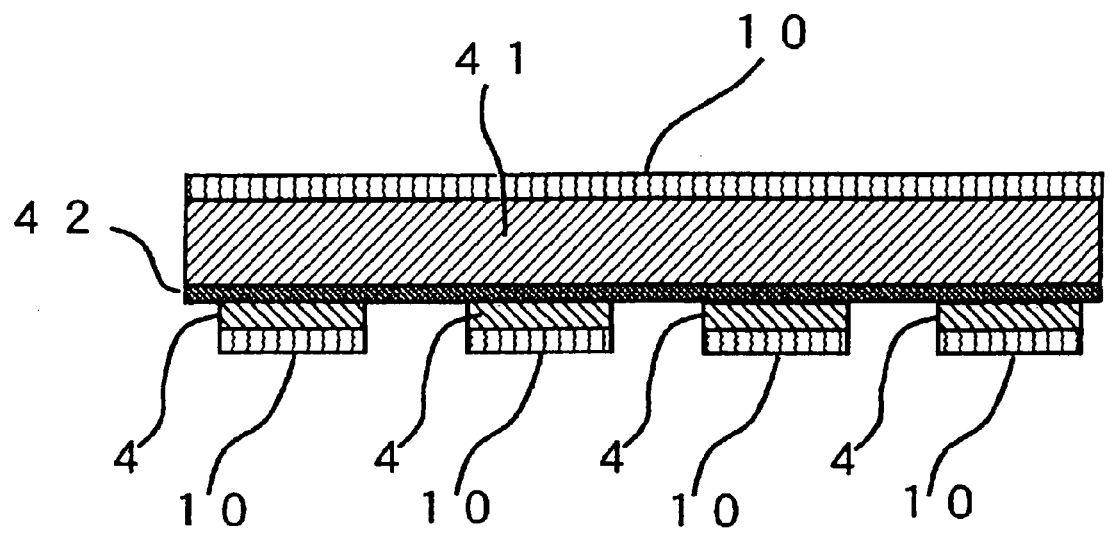
FIGS. 15(c) to 15(d) are schematic cross-sectional views showing the manufacturing flow for manufacturing a copper foil circuit with carrier foil.
Figure 15:
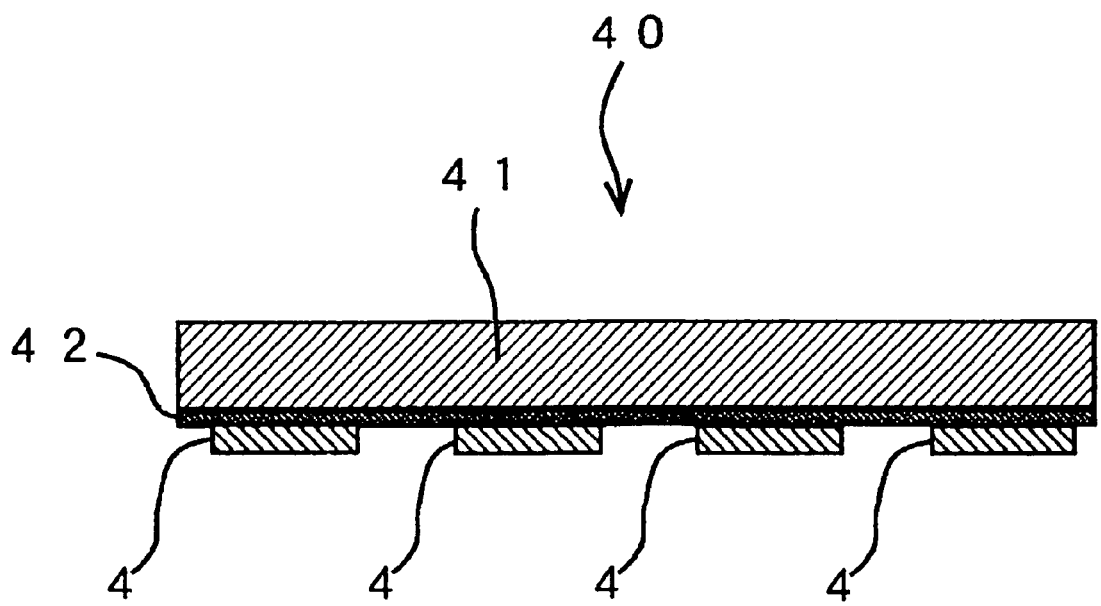

However, a core material obtained by the following production process is preferably used from the viewpoint of increasing production efficiency of the core material 2*b*. Specifically, as core material 2*b* is used copper foil circuit with carrier foil 40 that is obtained by etching the copper foil on the surface of copper foil with carrier foil so that it has circuits, which are to be base electrodes 4. There are two types of copper foil with carrier foil: peelable type and etchable type, both of which can be used in the core material. However, it is preferable to use a peelable type of copper foil with carrier foil which can simplify the step. And in a peelable type of copper foil with carrier foil, it is particularly preferable to use which is free from heavy metal and which includes an organic bonding interface layer of triazole compound having substituents, such as 1,2,3-benzotriazole or carboxybenzotriazole, between the carrier foil 41 and the circuits (base electrodes 4). The copper foil circuit with carrier foil 40 is obtained as follows. First, electrodeposited copper foil with carrier foil 44 is used which is prepared by forming organic bonding interface layer 42 on carrier foil 41 and forming copper foil layer for forming circuits 43 on the organic bonding interface layer 42. Then, an etching resist layer 10 is formed on the surface of the copper foil layer for forming circuits 43 of the electrodeposited copper foil with carrier foil, as shown in FIG. 14(*a*). And the copper foil layer for forming circuits 43, circuit pattern is exposed and developed, followed by copper etching to obtain the state shown in FIG. 15(*c*). Then, the etching resist layer is stripped to obtain copper foil circuits with carrier foil 40 as shown in FIG. 15(*d*). The organic bonding interface layer 42 is used to make it easier to release the carrier foil 41 from the copper foil circuits. Accordingly, the organic bonding interface layer 42 should exist at least between the carrier 41 and the copper foil circuits (base electrodes 4).

Figure 16:
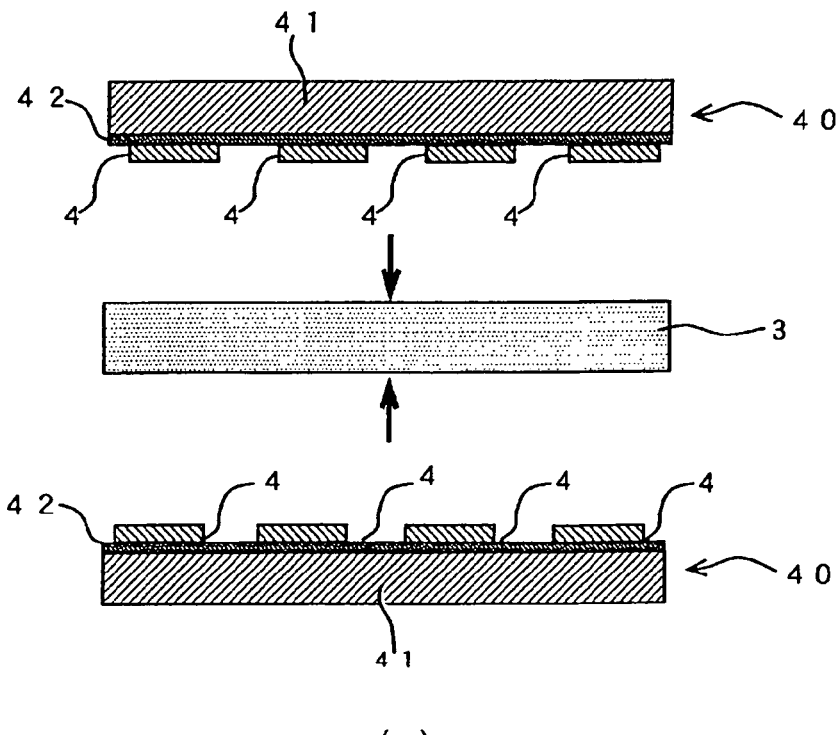
FIGS. 16(a) to 16(c) are schematic views showing the manufacturing flow of a printed wiring board (core material 2b) having a flat surface where base electrodes, which use copper foil circuits with carrier foil, are buried in its insulating layer.
Figure 16:
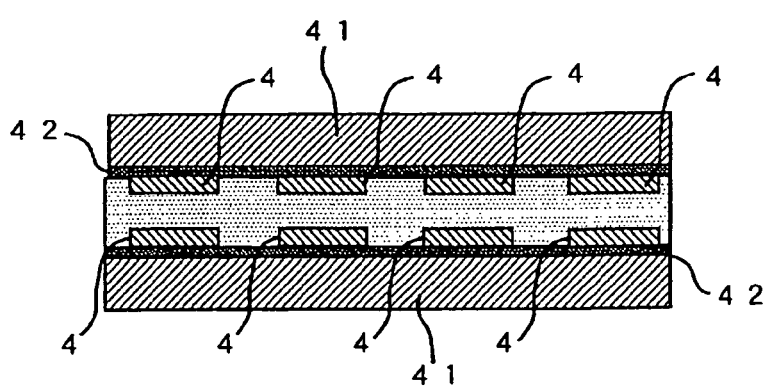
Figure 16:
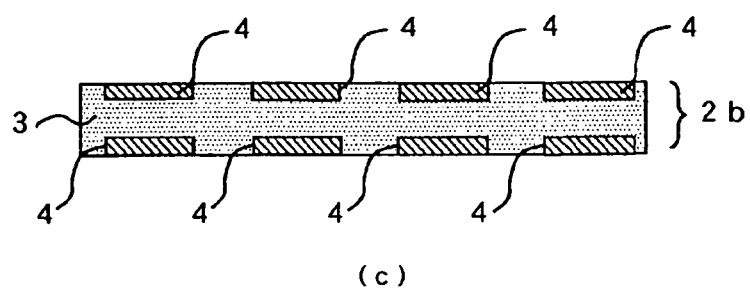
Figure 17:
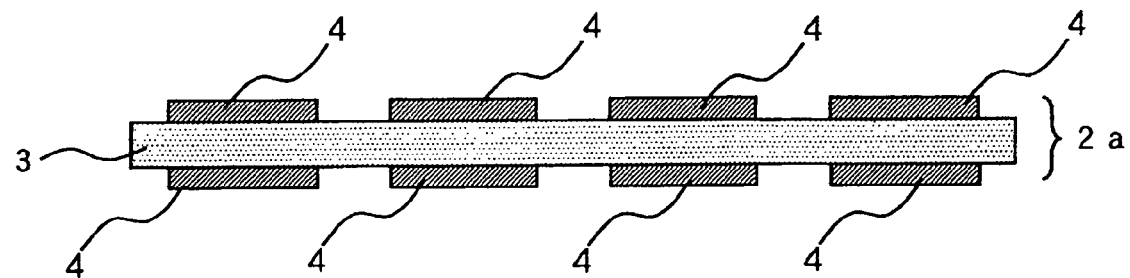
FIGS. 17(a) to 17(b) are schematic views showing the manufacturing flow for manufacturing a multilayer printed wiring board with capacitor circuits embedded in its inner layers using core material 2a (conventional method)
Figure 17:
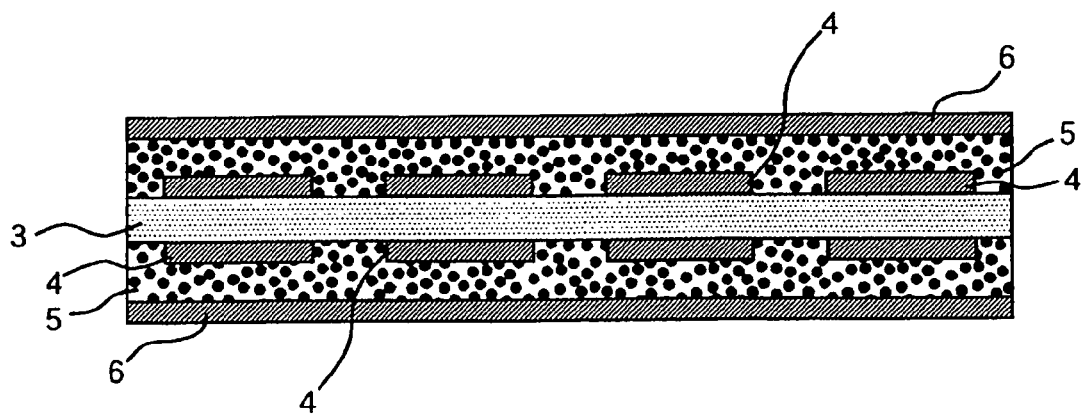
Figure 18:
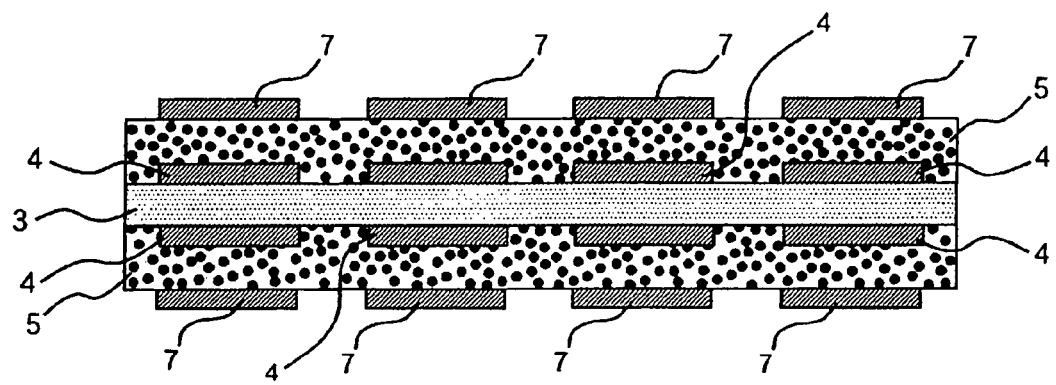
FIGS. 18(c) to 18(d) are schematic views showing the manufacturing flow for manufacturing a multilayer printed wiring board with capacitor circuits embedded in its inner layers using core material 2a (conventional method)
Figure 18:
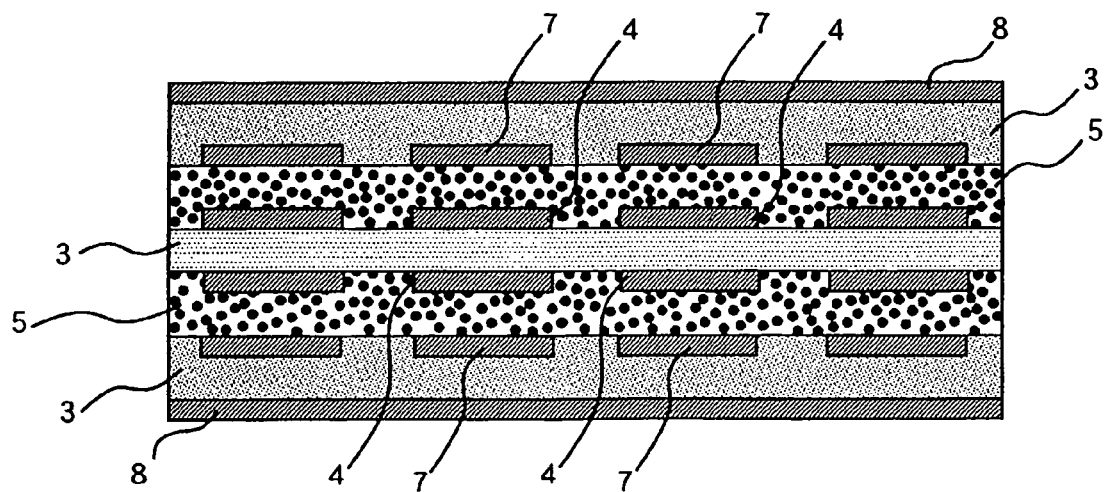
Figure 19:
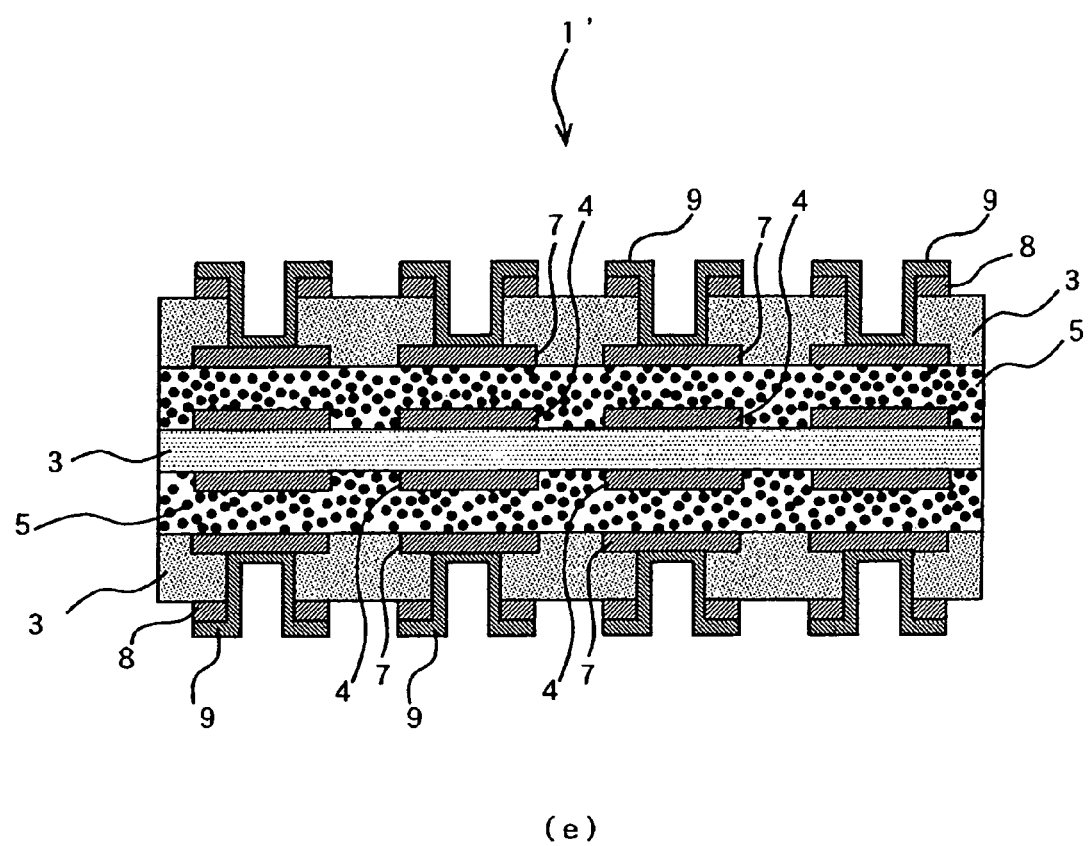
FIG. 19(e) is a schematic view showing the manufacturing flow for manufacturing a multilayer printed wiring board with capacitor circuits embedded in its inner layers using core material 2a (conventional method).

The core material is obtained by using the copper foil circuit with carrier foil 40 and prepreg 11. The copper foil circuit with carrier foil 40 and prepreg 11 are laid on so that the surface of the copper foil circuit with carrier foil on which copper foil circuit formed comes in contact with the prepreg, and they undergoes hot pressing to obtain a laminate. And the carrier foil to be locating on outer side of the laminate is released by peeling. This is schematically illustrated in FIG. 16. The core material 2*b* in which copper foil circuits (base electrodes 4) are buried in the base material resin is obtained by the processes shown in FIGS. 16(*a*) to 16(*c*). Since the copper foil circuits do not protrude from the substrate surface, unlike with popular printed wiring boards, the circuits are less likely to be caught on something when the board is handled, whereby open circuit defects can be prevented. And the flat surfaces make it possible to laminate a dielectric layer containing dielectric filler directly on the core material.

To connect the base electrode circuits on both sides of a base electrode circuits by using a through hole or via hole, layer to layer connection formation is performed by the popular method before etching the base electrode circuit.

Laminating dielectric layer 5 and first conductive metal layer (metal foil) 6 on both sides of the core material gives a laminate in the state shown in FIG. 9(*b*). The lamination of dielectric layer and first conductive metal layer will be described later. To the term "dielectric layer" herein used, the same concept as described above applies.

To provide a dielectric layer and a first conductive metal layer on both sides of the core material, as already described above, a method is employed in which dielectric-filler-containing layer sheet 30 and metal foil 6 are used independently, as shown in FIG. 5(*i*), or in which dielectric-filler-containing resin coated metal foil 23 is used, as shown in FIG. 5(*ii*). However, use of dielectric-filler-containing resin coated metal foil 23 shown in FIG. 5(*ii*) seems more advantageous, because it provides a thinner finished dielectric layer. In this process, however, a dielectric-filler-containing sheet can be used which has only a layer that contains dielectric filler, as is seen from FIG. 5(*i*). Likewise, a dielectric-filler-containing resin coated metal foil is used whose dielectric-filler-containing resin layer has only a layer that contains dielectric filler, as is seen from FIG. 5(*ii*).

The dielectric filler containing resin coated metal foil is obtained, as shown in FIG. 6(A), by coating the above described dielectric-filler-containing resin solution onto the bonding surface of metal foil 6 to a specified thickness so that film of dielectric-filler-containing resin solution 20 is formed, and the film is dried. To keep the thickness of dielectric layers uniform, a copper foil product used in a copper clad laminate that constitutes a capacitor layer is preferably as flat as possible. Accordingly, very-low-profile (VLP) copper foil or rolled copper foil is preferably used. In the drawings, black dots indicate dielectric filler F. Thus, dielectric layer 2 in the semi-cured state can be formed to arbitrarily thickness on metal layer 6.

Step B, step C, step D and step E which correspond to those of the process shown in FIGS. 9 to 12 are as already described above, and therefore, the description will be omitted to avoid the repetition.

<Method 3 for Manufacturing a Multilayer Printed Wiring Board with Embedded Capacitor Circuits>

A method for manufacturing a multilayer printed wiring board with capacitor circuits embedded in its inner layer(s)

Figure 8:
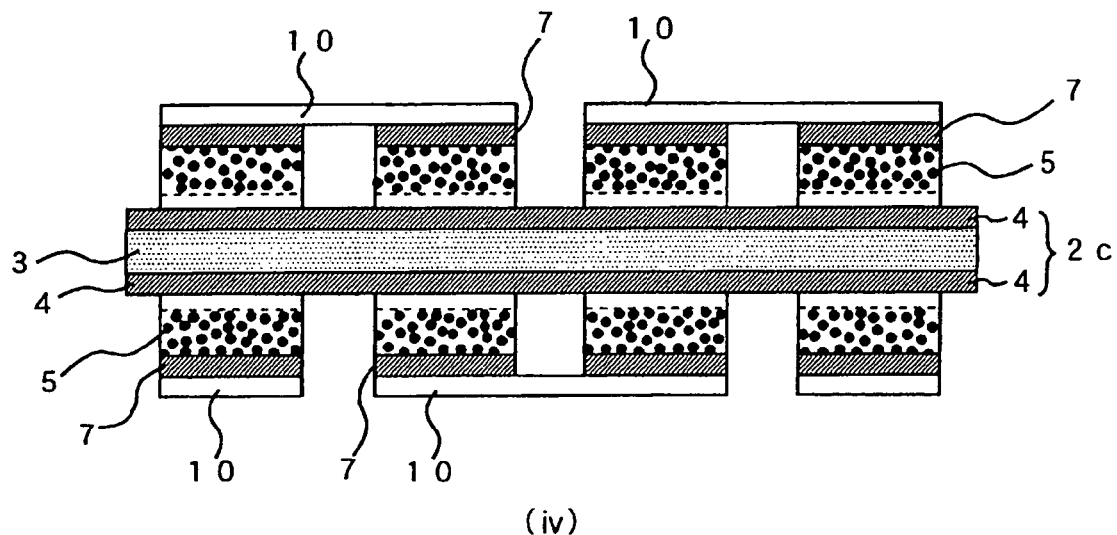
FIGS. 8(IV) to 8(V) are schematic views showing the manufacturing flow for manufacturing a multilayer printed wiring board with embedded capacitor circuits using core material 2c.
Figure 8:
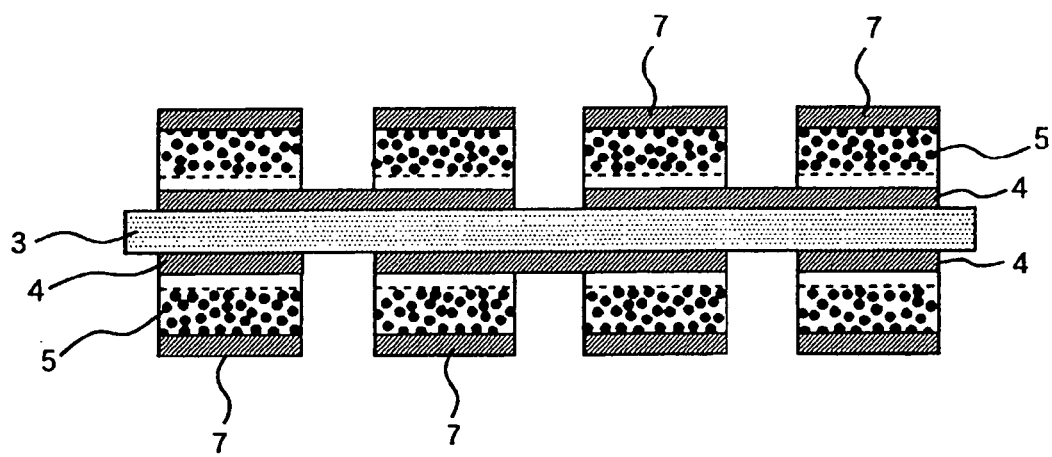

(hereinafter referred to simply as "multilayer printed wiring board"), which is according to the present invention, will be described mainly using FIGS. 7 to 8. The description will be omitted of the portion to which the same concept as that described in <Method 1 for manufacturing a multilayer printed wiring board with embedded capacitor circuits> and <Method 2 for manufacturing a multilayer printed wiring board with embedded capacitor circuits> is applicable.

The method for manufacturing a multilayer printed wiring board of the present invention is characterized not only in that it includes steps A to E described below, but in that it includes step F. Accordingly, the method will be described briefly in terms of steps A to E and intensively in terms of step F. It specifies that the method described below just employs the most typical and popular process for manufacturing a multilayer printed wiring board, and therefore, it is applicable to any process for manufacturing a multilayer printed wiring board that contains the technical idea below.

(Step A2)

In this step, a dielectric layer and a first conductive metal layer are provided on the whole surface of one side or both sides of a core material having a metal layer, which is to be base electrode circuits, on one side or both sides of its insulating layer. The step is referred to as first-conductive-metal-layer laminating step.

The core material 2c used in this process is shown in FIG. 1(C). A core material obtained by any production process can be used, as long as it has metal for forming base electrode circuits bonded on the whole surface of both sides of its insulating layer 3 and its surfaces are flat.

This process is different from the other processes in that it includes, between step C and step D, conventionally used circuit forming step F for processing base electrode circuits. Step B, step C, step D and step E are as already described above, and therefore, the description will be omitted to avoid the repetition. And the formation of base electrode circuits, which is characteristic to step F, shown in FIGS. 7 to 8 will be described.

On the surface of the portions from which dielectric layers have been already removed, the surface of metal for forming base electrode circuits is exposed as shown in FIG. 7(III). To form base electrode circuits by etching, a dry film resist is laminated, then exposure and development are performed to obtain a laminate in the state shown in FIG. 8(IV). Then the metal foil for base electrode circuits is etched and the resist is stripped to obtain a laminate in the state shown in FIG. 8(V).

<Multilayer Printed Wiring Board with Embedded Capacitor Circuits>

A multilayer printed wiring board with embedded capacitor circuits is obtained through the above described steps. In such a multilayer printed wiring board, no dielectric layer exists in the area other than those of the embedded capacitors and each of the capacitor circuit portions is held in the insulating layer constituting resin, whereby the problem of adhesion between the dielectric layer and the insulating layer is not created and the occurrence of delamination in the inner layer(s) is decreased. Moreover, as long as the manufacturing method is employed, the dielectric layers are allowed to have excellent thickness uniformity, and the capacitor circuits are allowed to have high registration accuracy, whereby the deviation in capacitor capacitance can be lessened.

In the following, several examples will be shown. First, the items common to the examples will be described.

EXAMPLE 1

(Preparation of Core Material)

Based on the popular method, a double sided copper clad laminate was prepared by laminating 18 μm thick electrodeposited copper foil on both sides of a 50 μm thick FR-4 prepreg. The copper foil on both sides of the double sided copper clad laminate was cleaned by polishing and acid pickling, and dried. Then, a dry film resist was laminated on the copper foil on both sides of the laminate, and the etching pattern was exposed on the etching resist and developed. Then, etching was performed with a copper etchant to form base electrode circuits having base electrode shapes. After the resist stripping was performed with an alkaline solution, the laminate was rinsed and dried to obtain a core material.

(Preparation of Dielectric Filler Containing Resin Coated Metal Foil)

First, a resin solution was prepared. In the preparation of the binder resin solution, the raw materials used were 39 parts by weight of phenol novolac type epoxy resin, 39 parts by weight of a solvent soluble aromatic polyamide resin polymer BP3225-50P commercially available as a blended varnish mixed with cyclopentanone as a solvent from Nippon Kayaku Co., Ltd. To finish preparation of a resin mixture having the blending ratios shown below, curing agent MEH-7500a, novolac type phenolic resin from Meiwa Plastic Industries, Ltd., and a curing accelerator 2E4MZ from SHIKOKU CHEMICALS CORPORATION were added to the varnish.

Resin Composition:

| | |
|---|---|
| phenol novolak type of epoxy resin | 39 parts by weight |
| aromatic polyamide resin polymer | 39 parts by weight |
| novolak type of phenol resin | 22 parts by weight |
| curing accelerator | 0.1 part by weight |

The solid resin content of the resin solution was adjusted to 30% by weight by using methyl ethyl ketone adding to the resin mixture. And into the resin solution, barium titanate powder, as dielectric filler having powder characteristics shown below, was mixed in the dispersed manner to obtain a dielectric-filler-containing resin solution having the following composition.

Powder Characteristics of Dielectric Filler:

Powder Characteristics of the Dielectric Filler:

| | |
|---|---|
| Average particle size ($D_{IA}$) | 0.25 μm |
| Volume cumulative particle size ($D_{50}$) | 0.5 μm |
| Coagulation degree ($D_{50}/D_{IA}$) | 2.0 |

Dielectric-filler-containing Resin Solution:

| | |
|---|---|
| binder resin solution | 83.3 parts by weight |
| barium titanate powder | 100 parts by weight |

The filler-containing resin solution thus obtained was coated onto the bonding surface (the surface having undergone roughening treatment with fine copper particles 21) of electrodeposited copper foil 6 by using edge coater, so that a film of dielectric-filler-containing resin 20 having a specified thickness was formed. After being air-dried for 5 minutes, the resin film was further dried for 3 minutes in a heating atmosphere at 140° C. to form dielectric layer 22 in the semi-cured state whose thickness was 20 μm. Then, the above described resin solution was further coated onto dielectric layer 22 and dried to form a 5 μm thick resin-alone layer. Thus, dielectric filler containing resin coated metal foil 23 was obtained. The electrodeposited copper foil used here was 35 μm thick and the average roughness of its bonding surface was 2.1 μm.
(Step A)

Figure 10:
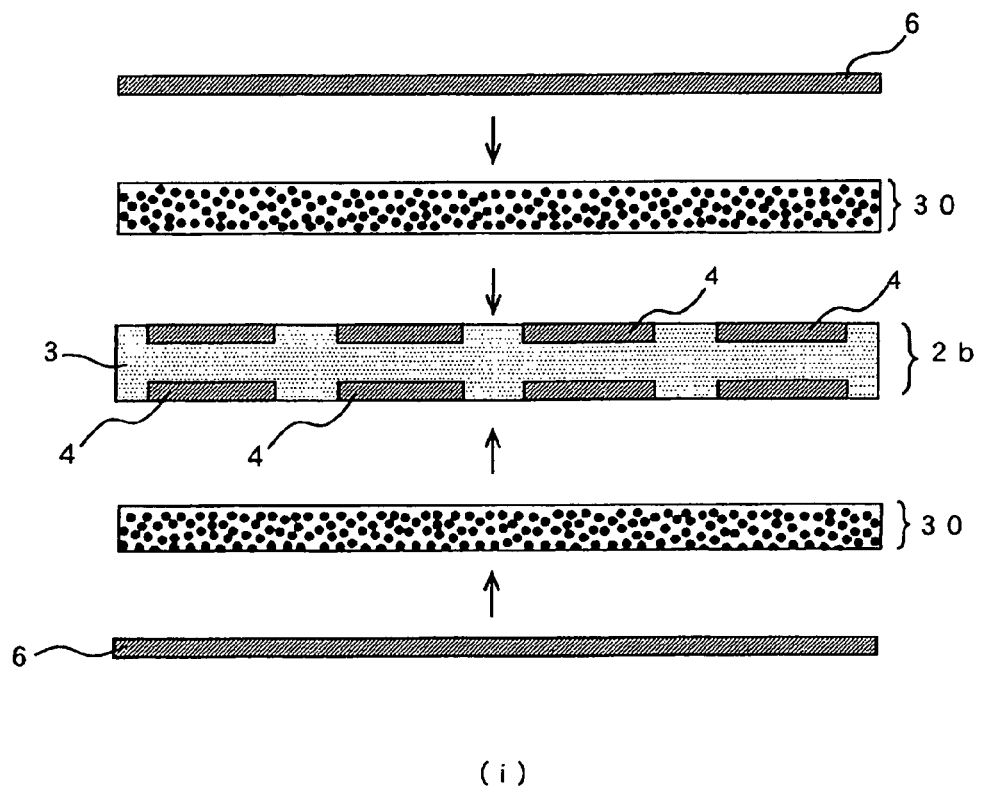
Figure 10:
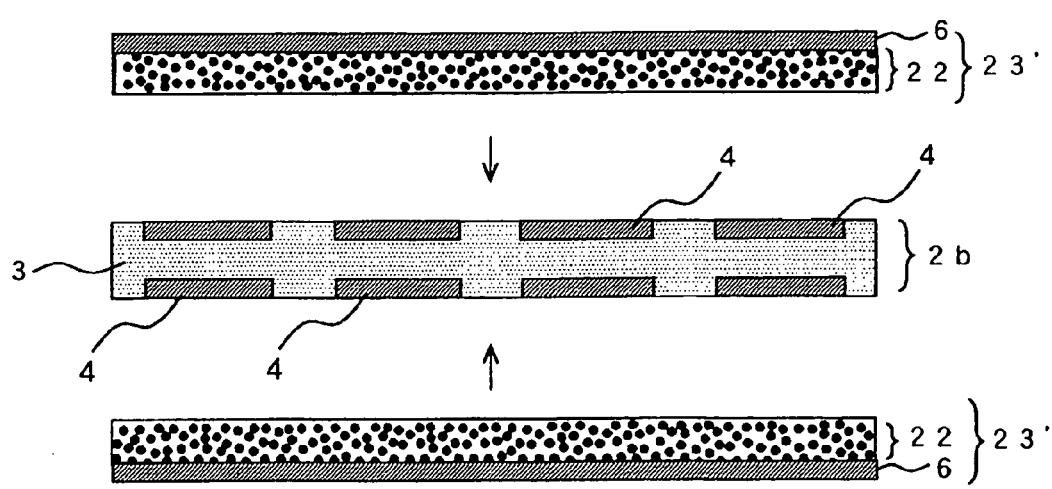

In this step, a dielectric layer and a first conductive metal layer were provided on both sides of a core material as shown in FIG. 9(*a*). As a core material, the core material described above was used and as a dielectric layer and a first conductive metal layer, the dielectric filler containing resin coated metal foil described above was used. To provide a dielectric layer and a first conductive metal layer on both sides of the core material, the dielectric filler containing resin coated metal foil 23 was laminated on the core material 2 by bringing the dielectric layer 22 of the dielectric filler containing resin coated metal foil 23 into contact with the base electrode circuit surface of the core material and hot pressing the same at 180° C. for 60 minutes, as shown in FIG. 10(*ii*), to obtain a laminate shown in FIG. 9(*b*).
(Step B)

Figure 11:
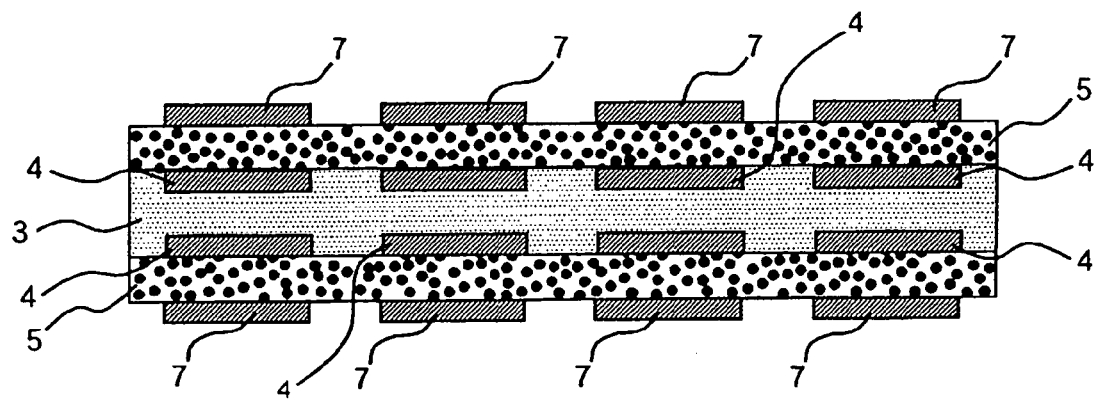
FIGS. 11(c) to 11(d) are schematic views showing the manufacturing flow for manufacturing a multilayer printed wiring board with embedded capacitor circuits using core material 2b.
Figure 11:
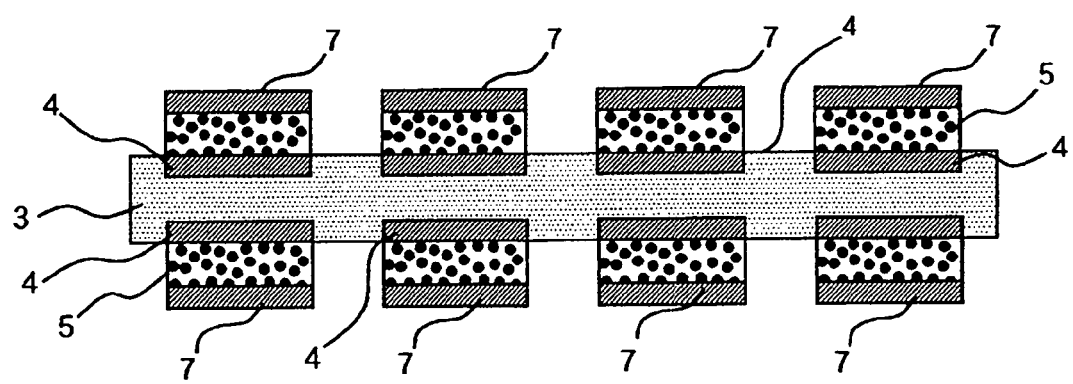

In this top-electrode forming step, the first conductive metal layers 6 shown in FIG. 9(*b*) were processed into top electrode circuits (including top electrodes of capacitors) and the dielectric layers in the area other than those of the circuit portions were exposed. To do this, a dry film resist as an etching resist was laminated on the surface of each first conductive metal layer 6 to give an etching resist layer, the resist pattern is exposed on the etching resist and developed, the unnecessary portion of each first conductive metal layer 6 was dissolved and removed by using an etchant, and the resist was stripped. The top electrodes were formed as shown in FIG. 11(*c*). Each of the top electrodes thus formed included a circuit shape, which was to be top electrode 7 of a capacitor, and the top electrodes and the base electrodes 4 formed in the inner layer were formed in symmetrical shape and locating across dielectric layer 5.
(Step C)

In this dielectric-layer removing step, the exposed dielectric layers in the area other then those of the circuit portions were removed to obtain the state shown in FIG. 11(*d*). Removing of the dielectric layers was carried out by de-smear treatment using a commercially available de-smear solution. The de-smear solution used was a commercially available one.
(Step D)

Figure 12:
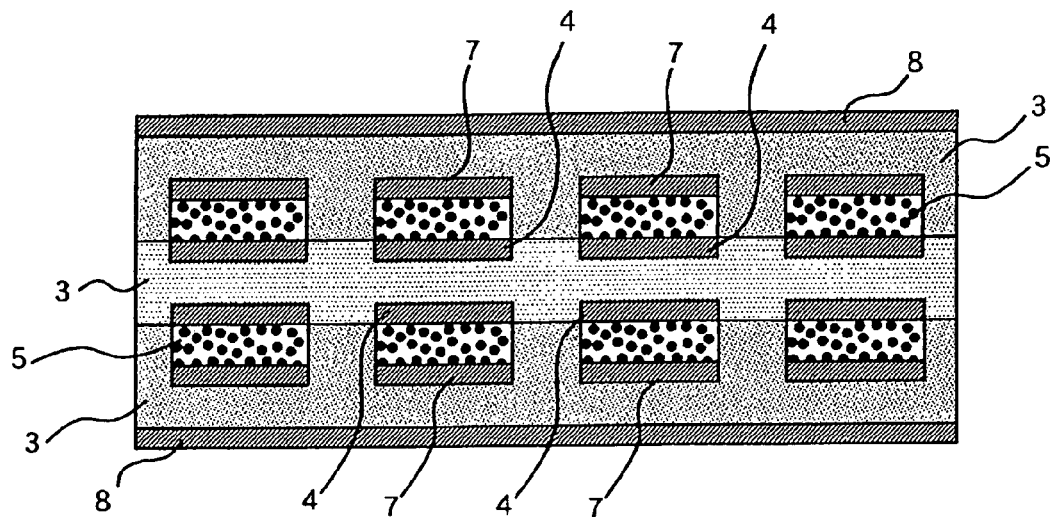
FIGS. 12(e) to 12(f) are schematic views showing the manufacturing flow for manufacturing a multilayer printed wiring board with capacitor circuits embedded in its inner layers using core material 2b.
Figure 12:
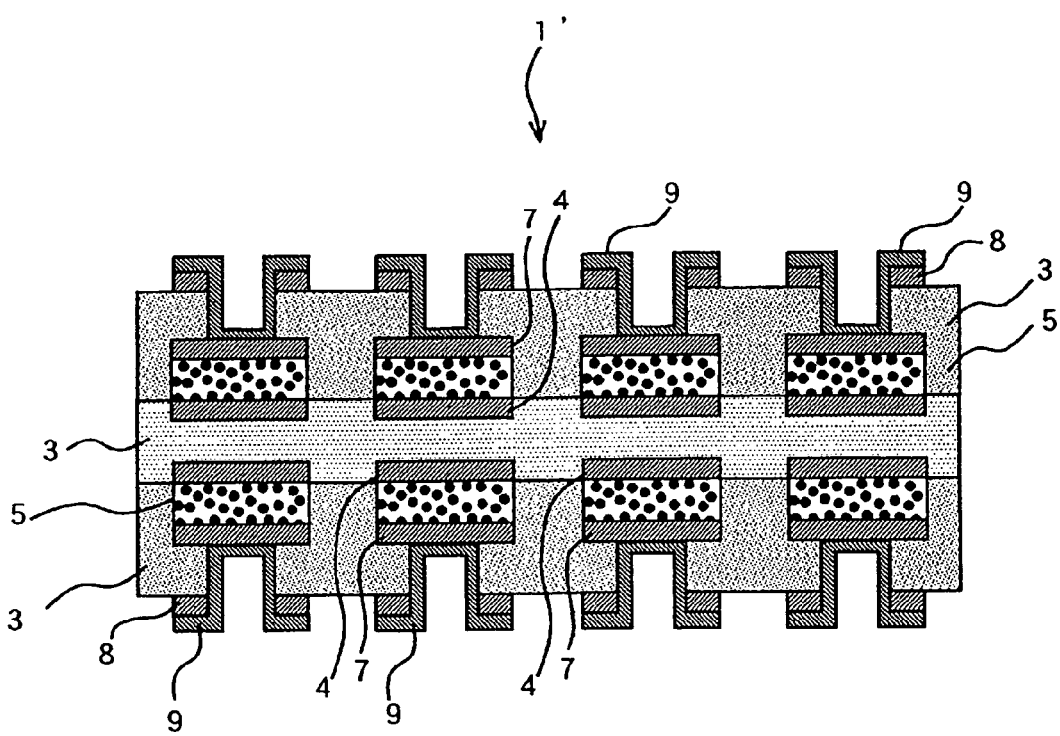
Figure 13:
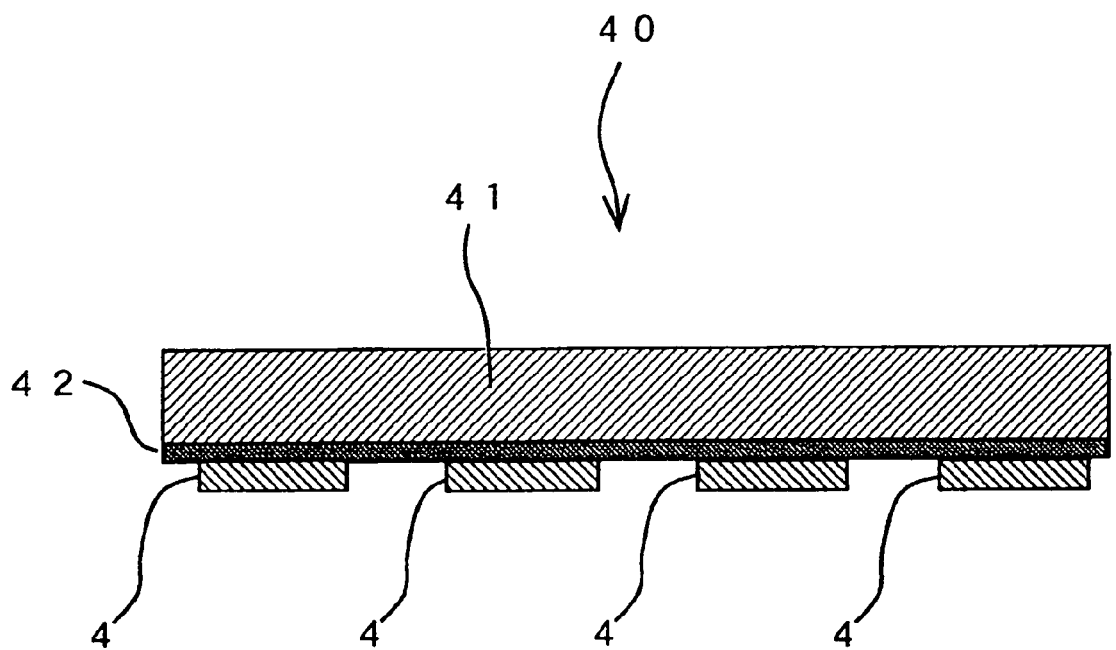
FIG. 13 is a schematic cross-sectional view of a copper foil circuit with carrier foil.

In this second conductive metal layer laminating step, the gaps among the circuits which had deepened by the removing of the exposed dielectric layer were filled in and insulating layer 3*b* and a second conductive metal layer 8 were provided on the top electrodes 7, as shown in FIG. 12(*e*). The insulating layer 3*b* and second conductive metal layer were formed in such a manner as to lay a 100 μm thick prepreg (in the drawings, illustration of skeletal material is omitted) on the top electrodes and then electrodeposited copper foil on the prepreg and hot-press them at 180° C. for 60 minutes.
(Step E)

In this outer layer circuit forming step, the second conductive metal layers 8 were processed into outer layer circuits 9 by etching the same while forming via holes. The method of etching the second conductive metal layers 8 while forming via holes was the same as that of etching the first conductive metal layer; therefore, to avoid repetition, the description of the method will be omitted. A multilayer printed wiring board with embedded capacitor 1', as shown in FIG. 12(*f*), was thus manufactured.

EXAMPLE 2

Example 2 is the same as Example 1 in step A, step D and step E but different from Example 1 in step B and step C. Accordingly, the description of step A, step D and step E will be omitted to avoid repetition and the description just on step B and step C will be shown.
(Step B)

In this top-electrode forming step, the first conductive metal layers 6 locating as outer layers were processed into top electrodes 7 of capacitors and the dielectric layers in the area other than those of the circuit portions were exposed. To do this, a dry film resist as an etching resist was laminated on the surface of each first conductive metal layer 6 to give an etching resist layer, the resist pattern is exposed on the etching resist and developed, the unnecessary portion of each first conductive metal layer 6 was dissolved and removed by using an etchant, and the etching resist 10 was allowed to remain on the surface of the circuits even after the top electrodes 7 were formed, as shown in FIG. 7(I). Each of the top electrodes thus formed have a circuit shape, which was to be an top electrode 7 of a capacitor, and the top electrodes 7 were formed to be symmetrical shape and position across dielectric layer 5 and the base electrodes 4 in the inner layer.
(Step C)

In this dielectric-layer removing step, the exposed dielectric layers in the area other then those of the circuit portions were removed while allowing etching resists 10 to remain on the surface of the circuits. The removing method of the dielectric layers was carried out by wet blasting treatment. Specifically, the unnecessary dielectric layer was removed by abrasion, in particular, by shooting a slurry-like abrasive fluid in which alumina abrasive, fine powder 14 μm in median diameter, was dispersed in water (the concentration of abrasive 14 vol %) as high-velocity fluid stream on the target surface at water pressure of 0.20 MPa through a slit nozzle 90 mm long and 2 mm wide. After finishing the wet blasting treatment, etching resist stripping, rinsing and drying were performed in this order to obtain a laminate in the state shown in FIG. 3(*d*).

After carrying out the steps shown in FIG. 3, as manufacturing flow, in the same manner as Example 1, a multilayer printed wiring board with embedded capacitor 1' was manufactured.

EXAMPLE 3

(Preparation of Core Material)

The manufacturing of the core material used in Example 3 will be described with reference to the accompanying drawings. The copper foil circuit with carrier 40 used in this embodiment was obtained by using electrodeposited copper foil with carrier foil 44, which was made by using electrodeposited copper foil having a nominal thickness of 18 μm as carrier foil 41, forming organic bonding interface layer 42 on the shiny side of the carrier foil 41 by using carboxybenzotriazole, and forming copper foil layer for forming circuit 43 having a thickness of 5 μm on the organic bonding interface layer 42. On the copper foil layer for forming circuit 43, fine copper particles 21 are put on its surface. And rust-proofing with zinc on both sides of the electrodeposited copper foil with carrier foil 44 is performed. In the accompanying drawings, the illustration of the rust-proofing layer is omitted.

A dry film resist was laminated on the surface of the electrodeposited copper foil with carrier foil 44 to form etching resist layer 10, as shown in FIG. 14(*a*). For forming the etching resist layer 10, a dry film resist (Nichigo ALPHO: manufactured by the Nippon Synthetic Chemical Industry Co., Ltd.) was used. And as shown in FIG. 14(*b*), a desired circuit pattern was exposed to the etching resist layer 10 and developed. At the time, etching resist layer 10 have been formed on the whole surface of the carrier foil 41, by using the same dry film resist as shown in FIGS. 14(*a*) and 14(*b*).

After that, the copper foil layer for forming circuit 43 was etched with a cupric chloride etchant to form base electrodes 4 as shown in FIG. 15(*c*). After forming base electrodes 4, the dry film resist was swelled and stripped to obtain a copper foil circuit with carrier 40 of the present invention as shown in FIG. 15(*d*).

This copper foil circuit with carrier 40 and the prepreg 3, which was a constituent of the resin base material, were subjected to hot pressing. As shown in FIG. 16(*a*), a sheet of copper foil circuit with carrier 40 was arranged on each side of prepreg 3 in such a manner that put the each copper foil circuit with carrier 40 facing the surfaces where base electrodes 4 have already formed to the prepreg 3. Then, they were laminated and subjected to pressing to give a laminate as shown in FIG. 16(*b*).

After finishing the hot pressing, the carrier foil 41 locating as an outer layer was released by peeling. Core material 2*b* as shown in FIG. 16(*c*) was thus obtained.

(Preparation of Dielectric Filler Containing Resin Coated Metal Foil)

The dielectric-filler-containing resin solution used here was the same as the one used in Example 1, and thus, its description will be omitted to avoid the repetition. As shown in FIG. 6(A), the filler-containing resin solution was coated on the bonding surface of electrodeposited copper foil 6 (the surface having undergone roughening treatment with fine copper particles 21) by using an edge coater, so that film of dielectric-filler-containing resin 20 having a specified thickness was formed. The formed film was subjected to air-drying for 5 minutes and then to drying treatment in a heating atmosphere at 140° C. for 3 minutes to form dielectric layer 22 in the semi-cured state whose thickness is 20 µm, which was used as dielectric filler containing resin coated metal foil 23'. The electrodeposited copper foil used here was also the same as that used in Example 1, which was 35 µm thick.

A multilayer printed wiring board with embedded capacitor circuits 1' was manufactured by using the core material and dielectric-filler-containing resin coated copper foil described above by the same process as that of Example 2.

INDUSTRIAL APPLICABILITY

The method of the present invention for manufacturing a multilayer printed wiring board with an embedded capacitor circuits can provide a printed wiring board in which the dielectric layers of the embedded capacitor circuits have excellent thickness uniformity, even if their thickness is decreased, and the capacitors have satisfactory capacitance. Besides, since no dielectric layer exists on the sites of the surface where no dielectric layer is needed after embedded capacitor circuits have been already formed, dielectric loss in signal circuits is small during the time signals are transmitted and other circuit devices such as an inductor can also be buried. Thus, circuit design is made easier and the design variation is far increased. The multilayer printed wiring board with embedded capacitor circuits which is obtained by the manufacturing method of the present invention is of very high quality, and besides, it can be efficiently manufactured with the above described manufacturing method and is easy to deliver in the market.

The invention claimed is:

1. A method for manufacturing a multilayer printed wiring board with an embedded capacitor circuit, which is characterized by comprising the following steps A1 to E:

step A1: a first-conductive-metal-layer laminating step where a dielectric layer and a first conductive metal layer are provided on the surface having a base electrode of a core material with base electrode(s) on one side or both sides of its insulating layer;

step B: an top-electrode fowling step where the first conductive metal layer(s) locating as an outer layer(s) is(are) processed into top electrodes and the dielectric layer(s) in the area other than those of the circuit portions is(are) exposed;

step C: a dielectric-layer removing step where the exposed dielectric layer, which is in the area other than those of circuit portions, is removed;

step D: a second-conductive-metal laminating step where the gaps among the top electrodes are filled in and an insulating layer and a second conductive metal layer are provided on the top electrodes; and step E: an outer layer circuit forming step where the second conductive metal layer is processed into outer layer circuits, wherein in the dielectric-layer removing step, a chemical treatment is used to remove the exposed dielectric layer(s), which are in the area other than those of circuit portions for the top electrodes, wherein the chemical treatment comprises a de-smear treatment.

2. The method for manufacturing a multilayer printed wiring board with an embedded capacitor circuit according to claim 1, wherein as the core material having base electrode circuits on one side or both sides of its insulating layer used in the above step A1 is a printed wiring board having an bumpy surface(s) where base electrodes protrude from the surface and the dielectric layer is provided on the surface by laminating a dielectric layer constituting material that consists of a resin-alone layer on a dielectric-filler-containing layer.

3. The method for manufacturing a multilayer printed wiring board with an embedded capacitor circuit according to claim 1, wherein as the core material having base electrode circuits on one side or both sides of its insulating layer used in the above step A1 is a printed wiring board having a flat surface(s) where base electrodes are buried in its insulating layer and the dielectric layer is provided on the surface(s) by laminating a dielectric-filler-containing layer.

4. A multilayer printed wiring board obtained by the method for manufacturing a multilayer printed wiring board with an embedded capacitor circuit according to claim 1.

5. A multilayer printed wiring board obtained by using a multilayer printed wiring board according to claim 4 as a core material and carrying out the following steps to multiply the dielectric layer:

step A2: a first-conductive-metal-layer laminating step where a dielectric layer and a first conductive metal layer are provided on the metal layer side(s) of a core material having a metal layer, which is to be base electrodes, on the whole surface of one side or both sides of its insulating layer;

step B: an top-electrode forming step where the first conductive metal layer(s) locating as an outer layer(s) is(are) processed into top electrodes and the dielectric layer(s) in the area other than those of circuit portions is(are) exposed;

step C: a dielectric-layer removing step where the exposed dielectric layer, which is in the area other than those of circuit portions, is removed;

step F: a step of forming a specified base electrode circuit Pattern on the laminate where the dielectric layer has been removed and the metal layer for base electrodes are exposed;

step D: a second-conductive-metal laminating step where the gaps among the top electrodes are filled in and an insulating layer and a second conductive metal layer are provided on the top electrodes; and step E: an outer layer circuit forming step where the second conductive metal layer is processed into outer layer circuits.

6. A multilayer printed wiring board, obtained by stacking plural multilayer printed wiring boards according to claim 4.

7. A method for manufacturing a multilayer printed wiring board with an embedded capacitor circuit, which is characterized by comprising the following steps A2 to F:

step A2: a first-conductive-metal-layer laminating step where a dielectric layer and a first conductive metal layer are provided on the metal layer side(s) of a core material having a metal layer, which is to be base electrodes, on the whole surface of one side or both sides of its insulating layer;

step B: an top-electrode forming step where the first conductive metal layer(s) locating as an outer layer(s) is(are) processed into top electrodes and the dielectric layer(s) in the area other than those of circuit portions is(are) exposed;

step C: a dielectric-layer removing step where the exposed dielectric layer, which is in the area other than those of circuit portions, is removed;

step F: a step of forming a specified base electrode circuit pattern on the laminate where the dielectric layer has been removed and the metal layer for base electrodes are exposed;

step D: a second-conductive-metal laminating step where the gaps among the top electrodes are filled in and an insulating layer and a second conductive metal layer are provided on the top electrodes; and step E: an outer layer circuit forming step where the second conductive metal layer is processed into outer layer circuits, wherein in the dielectric-layer removing step, a chemical treatment is used to remove the exposed dielectric layer(s), which are in the area other than those of circuit portions for the top electrodes, wherein the chemical treatment comprises a de-smear treatment.

8. A multilayer printed wiring board obtained by the method for manufacturing a multilayer printed wiring board with an embedded capacitor circuit according to claim 7.

9. A multilayer printed wiring board, obtained by using a multilayer printed wiring board according to claim 8 as a core material and carrying out the following steps to multiply the dielectric layer:

step A2: a first-conductive-metal-layer laminating step where a dielectric layer and a first conductive metal layer are provided on the metal layer side(s) of a core material having a metal layer, which is to be base electrodes, on the whole surface of one side or both sides of its insulating layer;

step B: an top-electrode forming step where the first conductive metal layer(s) locating as an outer layer(s) is(are) processed into top electrodes and the dielectric layer(s) in the area other than those of circuit portions is(are) exposed;

step C: a dielectric-layer removing step where the exposed dielectric layer, which is in the area other than those of circuit portions, is removed;

step F: a step of forming a specified base electrode circuit pattern on the laminate where the dielectric layer has been removed and the metal layer for base electrodes are exposed;

step D: a second-conductive-metal laminating step where the gaps among the top electrodes are filled in and an insulating layer and a second conductive metal layer are provided on the top electrodes; and step E: an outer layer circuit forming step where the second conductive metal layer is processed into outer layer circuits.

10. A multilayer printed wiring board, obtained by stacking plural multilayer printed wiring boards according to claim 8.

11. A method for manufacturing a multilayer printed wiring board with an embedded capacitor circuit, which is characterized by comprising the following steps A1 to E:

step A1: a first-conductive-metal-layer laminating step where a dielectric layer and a first conductive metal layer are provided on the surface having a base electrode of a core material with base electrode(s) on one side or both sides of its insulating layer;

step B: an top-electrode forming step where the first conductive metal layer(s) locating as an outer layer(s) is(are) processed into top electrodes and the dielectric layer(s) in the area other than those of the circuit portions is(are) exposed;

step C: a dielectric-layer removing step where the exposed dielectric layer, which is in the area other than those of circuit portions, is removed;

step D: a second-conductive-metal laminating step where the gaps among the top electrodes are filled in and an insulating layer and a second conductive metal layer are provided on the top electrodes; and step E: an outer layer circuit forming step where the second conductive metal layer is processed into outer layer circuits, wherein in the dielectric layer removing step, a mechanical treatment is used to remove the exposed dielectric layer(s), which are in the area other than those of circuit portions for the top electrodes, wherein the mechanical treatment comprises a blast treatment.

12. The method for manufacturing a multilayer printed wiring board with an embedded capacitor circuit according to claim 11, wherein the blast treatment comprises a wet blast treatment.

13. A method for manufacturing a multilayer printed wiring board with an embedded capacitor circuit, which is characterized by comprising the following steps A2 to F:

step A2: a first-conductive-metal-layer laminating step where a dielectric layer and a first conductive metal layer are provided on the metal layer side(s) of a core material having a metal layer, which is to be base electrodes, on the whole surface of one side or both sides of its insulating layer;

step B: an top-electrode forming step where the first conductive metal layer(s) locating as an outer layer(s) is(are) processed into top electrodes and the dielectric layer(s) in the area other than those of circuit portions is(are) exposed;

step C: a dielectric-layer removing step where the exposed dielectric layer, which is in the area other than those of circuit portions, is removed;

step F: a step of forming a specified base electrode circuit pattern on the laminate where the dielectric layer has been removed and the metal layer for base electrodes are exposed;

step D: a second-conductive-metal laminating step where the gaps among the top electrodes are filled in and an insulating layer and a second conductive metal layer are provided on the top electrodes; and step E: an outer layer circuit forming step where the second conductive metal layer is processed into outer layer circuits, wherein in the dielectric layer removing step, a mechanical treatment is used to remove the exposed dielectric layer(s), which are in the area other than those of circuit portions for the top electrodes, wherein the mechanical treatment comprises a blast treatment.

14. The method for manufacturing a multilayer printed wiring board with an embedded capacitor circuit according to claim 13, wherein the blast treatment comprises a wet blast treatment.

\* \* \* \* \*